US012787887B2

(12) United States Patent
Ren et al.

(10) Patent No.: US 12,787,887 B2
(45) Date of Patent: Nov. 3, 2026

(54) POLYCHROMIC LED STACK

(71) Applicant: Lumileds LLC, San Jose, CA (US)

(72) Inventors: Zhongmin Ren, Danville, CA (US); Robert Armitage, Cupertino, CA (US); Brendan Jude Moran, San Jose, CA (US); Hee Jin Kim, Fremont, CA (US); Rajiv Pathak, Milpitas, CA (US)

(73) Assignee: LUMILEDS LLC, San Jose, CA (US)

( * ) Notice: Subject to any disclaimer, the term of this patent is extended or adjusted under 35 U.S.C. 154(b) by 390 days.

(21) Appl. No.: 18/634,231

(22) Filed: Apr. 12, 2024

(65) Prior Publication Data

US 2025/0323224 A1 Oct. 16, 2025

(51) Int. Cl.
*H10W 90/00* (2026.01)
*H10H 20/81* (2025.01)
*H10H 20/812* (2025.01)
*H10H 20/831* (2025.01)

(52) U.S. Cl.
CPC ............ *H10W 90/00* (2026.01); *H10H 20/81* (2025.01); *H10H 20/812* (2025.01); *H10H 20/8312* (2025.01)

(58) Field of Classification Search
CPC ... H10W 90/00; H10H 20/81; H10H 20/8312; H10H 20/812
USPC ............................................................ 257/88
See application file for complete search history.

(56) References Cited

U.S. PATENT DOCUMENTS

2020/0287080 A1* 9/2020 Kim ..................... H10H 20/812
2020/0402964 A1* 12/2020 Kim .......................... C22C 5/02
2023/0111380 A1* 4/2023 Kim ....................... H10H 29/10 257/13
2023/0187470 A1 6/2023 Lopez-Julia et al.
2023/0420627 A1* 12/2023 Armitage ............... H10H 20/01

FOREIGN PATENT DOCUMENTS

CN 116613185 A 8/2023
WO 2025/216892 A1 10/2025

OTHER PUBLICATIONS

From the EPO as the ISA, "Notification of Transmittal of the International Search Report and the Written Opinion of the International Searching Authority, or the Declaration", PCT/US2025/021959, Jun. 18, 2025, 11 pages.

* cited by examiner

*Primary Examiner* — Igwe U Anya

(57) ABSTRACT

Three sets of LED layers each include p-doped and n-doped layers with an active layer therebetween, a tunnel junction layer against the p-doped layer, and an additional n-doped layer against the tunnel junction layer. The first and second LED layer sets are separated by a first semi-insulating semiconductor layer; the second and third LED layer sets are separated by a second semi-insulating semiconductor layer; the second LED layer set is between the first and second semi-insulating semiconductor layers; the third semiconductor layer set is between the second semi-insulating layer and a dielectric layer. Cathode contacts extend through the dielectric layer to the n-doped layers; anode contacts extend through the dielectric layer to the additional n-doped layers. The three LED layer sets can independently emit light at three different corresponding wavelengths, e.g., red, green, and blue light that can encompass an sRGB color gamut or can yield white light.

20 Claims, 21 Drawing Sheets

POLYCHROMIC LED STACK

FIELD OF THE INVENTION

The field of the present invention relates to light-emitting diodes (LEDs). A polychromic LED stack is disclosed, as well as methods of it manufacture.

SUMMARY

An inventive polychromic LED stack comprises first, second, and third sets of LED layers, first and second semi-insulating semiconductor layers, a dielectric layer, first, second, and third sets of anode contacts, and first, second, and third sets of cathode contacts. Each set of LED layers includes corresponding n-doped and p-doped semiconductor layers and a corresponding active layer therebetween. The three active layers emit light at three corresponding wavelengths that differ from one another. Each of the first and second sets of LED layers further includes a corresponding tunnel junction layer against the p-doped semiconductor layer and a corresponding additional n-doped semiconductor layer against the tunnel junction layer; the third set of LED layers further includes a TCO layer or a metal layer against the p-doped semiconductor layer, or a tunnel junction layer against the p-doped semiconductor layer and an additional n-doped semiconductor layer against the tunnel junction layer. The first semi-insulating semiconductor layer is between the first and send sets of LED layers, the second semi-insulating semiconductor layer is between the second and third sets of LED layer, the second set of LED layers is between the first and second semi-insulating semiconductor layers, and the third set of LED layers is between the second semi-insulating semiconductor layer and the dielectric layer. The cathode contacts are in electrical contact with corresponding n-doped semiconductor layers, and the anode contacts are in electrical contact with corresponding additional n-doped layers, TCO layer, or metal layer. The anode and cathode contacts extend past or through the dielectric layer.

Objects and advantages pertaining to polychromic LEDs may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Figure 1:
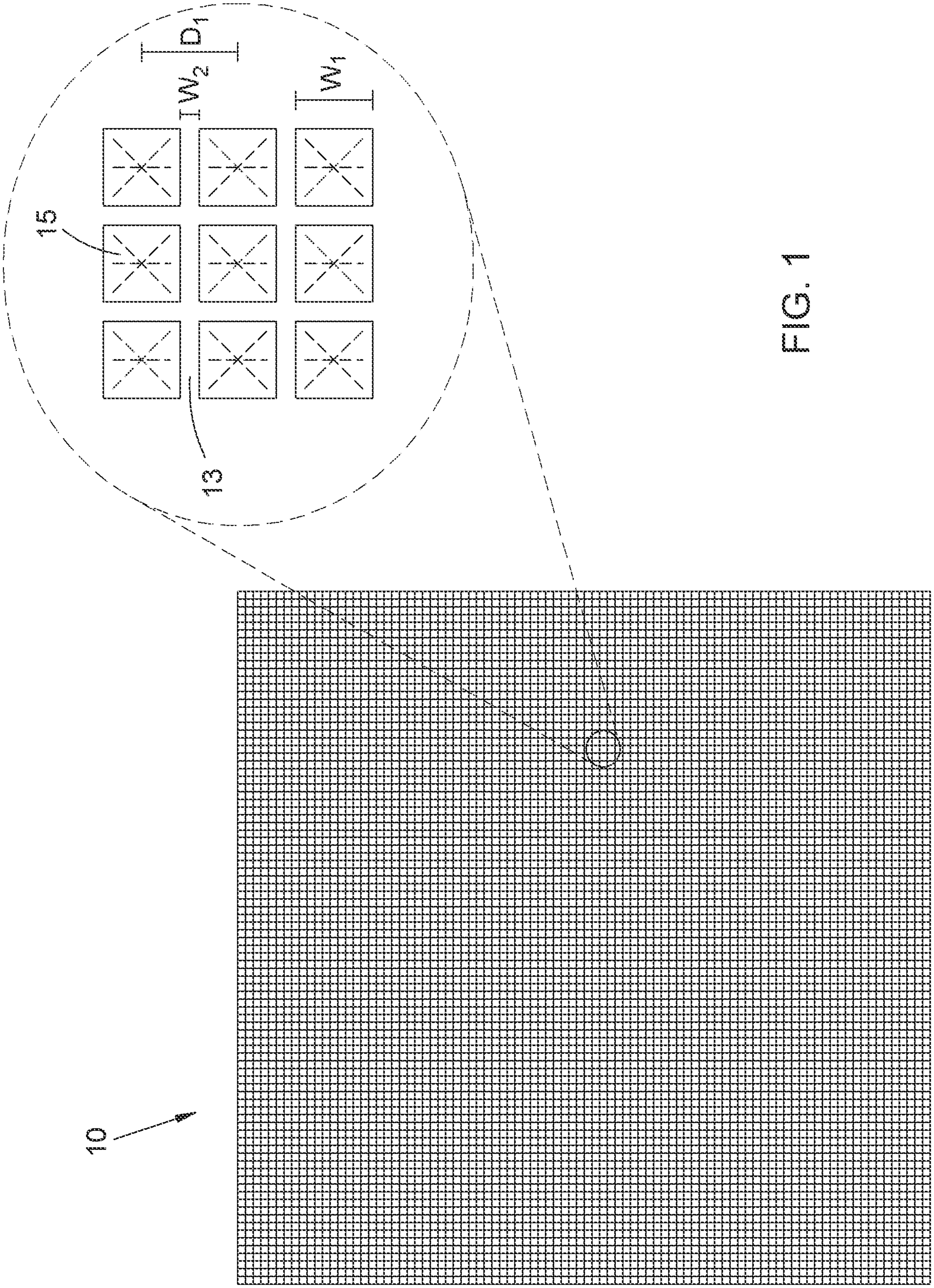
FIG. 1 shows a top schematic view of an example of an array of polychromic LEDs and an enlarged section of 3×3 polychromic LEDs of the array.

The embodiments depicted are shown only schematically; all features may not be shown in full detail or in proper proportion; for clarity certain features or structures (e.g., layer thicknesses) may be exaggerated or diminished relative to others or omitted entirely; the drawings should not be regarded as being to scale unless explicitly indicated as being to scale. In the drawings, some schematic illustrations of example structures or fabrication sequences described herein may be shown with precise right angles and straight lines, but it is to be understood that such schematic illustrations may not reflect real-life process limitations or defects. Such process limitations or defects can cause the features to look not so "ideal" when any of the structures described herein are examined using, e.g., scanning electron microscopy (SEM) images or transmission electron microscope (TEM) images. In such images of real structures, possible processing limitations or defects might be visible, e.g., not-perfectly straight edges of materials, tapered vias or other openings, inadvertent rounding of corners or variations in thicknesses of different material layers. There may be other limitations or defects not listed here that can occur within the field of device fabrication. The embodiments shown are only examples and should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter.

In many previous LED displays, a color gamut is provided by side-by-side red-, green-, and blue-emitting LEDs. Those LEDs are sufficiently small for the intended viewing conditions so that the individual LEDs are not perceived, and local relative outputs of adjacent red, green, and blue LEDs determine the perceived color at a given location on the display. Closer inspection of such an LED display would reveal the distinct red, green, and blue "sub-pixels" that form effective pixels of the display.

In addition, manufacture of such a display can be difficult. Integral formation of LEDs of different colors on a common growth substrate may be difficult or impossible. Assembly of large numbers of separately fabricated LEDs of different colors can also be difficult, particularly for large arrays (e.g., $10^4$ or more LEDs) of small LEDs (e.g., less than 200 microns or less than 100 microns across, i.e., microLEDs).

Accordingly, it would be desirable to provide an array of polychromic LEDs, i.e., an array of LED pixels that each can emit multiple different colors. Each LED includes a stack of distinct sets of LED layers, each set of LED layers being arranged to emit a different color and electrically isolated from one another to enable independent operation. A display incorporating such an array of polychromic LED stacks would not exhibit separate red, green, and blue sub-pixels, but instead would have pixels that each could emit any color within the color gamut provided by its constituent LED layer sets. Integral formation of the stack of LED layers on a common substrate and subsequent division of the LED layers into separate pixels eliminates the need for assembling LEDs of different colors.

Arrays of LEDs can include any suitable number of individual LEDs, e.g., on the order of $10^1$, $10^2$, $10^3$, $10^4$, $10^5$, $10^6$, or more LEDs. An example of an array 10 of polychromic LED stacks 15 is illustrated schematically in FIG. 1. The individual polychromic LED stacks 15 (also referred to as pixels, particularly when the array 10 is employed as a display) may have widths $w_1$ (e.g., side lengths) in the plane of the array 10, for example, less than 1 millimeter, less than 500 microns, less than 200 microns, less than 100 microns, less than 50 microns, less than 20 microns, less than 10 microns, or less than 5 microns. Polychromic LED stacks 15 in the array 10 may be spaced apart from each other by streets, lanes, or trenches 13 having a width $w_2$ in the plane of the array 10 of, for example, hundreds of microns, less than 100 microns, less than 50 microns, less than 20 microns, less than 10 microns, or less than 5 microns. The pixel pitch or spacing $D_1$ is the sum of $w_1$ and $w_2$; the pixel separation is equal to $w_2$. Although the illustrated examples show rectangular polychromic LED pixels 15 arranged in a symmetric array 10, the pixels and the array may have any suitable shape or arrangement, whether symmetric or asymmetric. Multiple separate arrays of polychromic LEDs can be combined in any suitable arrangement in any applicable format to form a larger combined array or display.

Figure 2A:
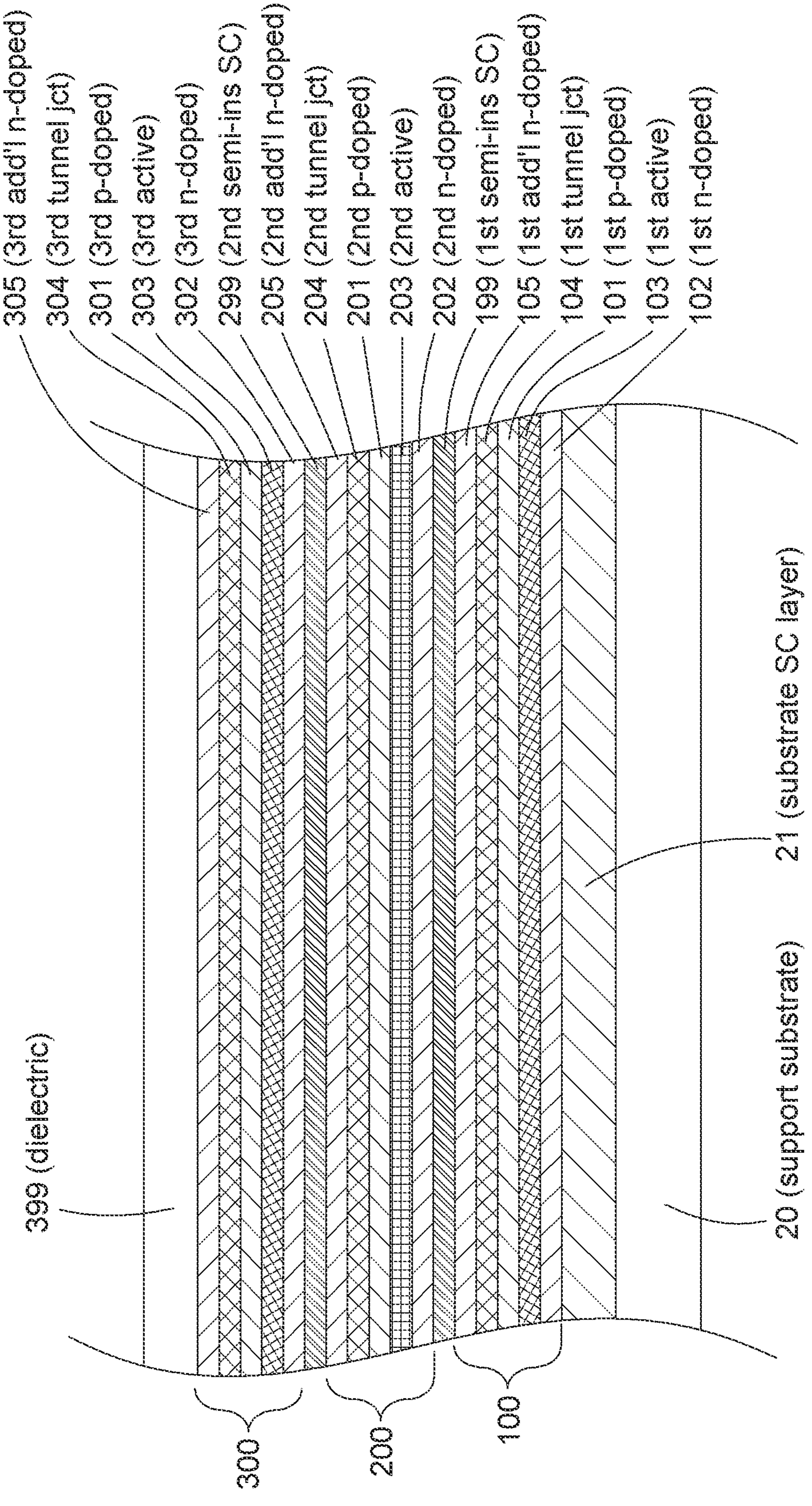
FIGS. 2A and 2B illustrate schematically two examples of inventive semiconductor layer sequences.
Figure 2B:
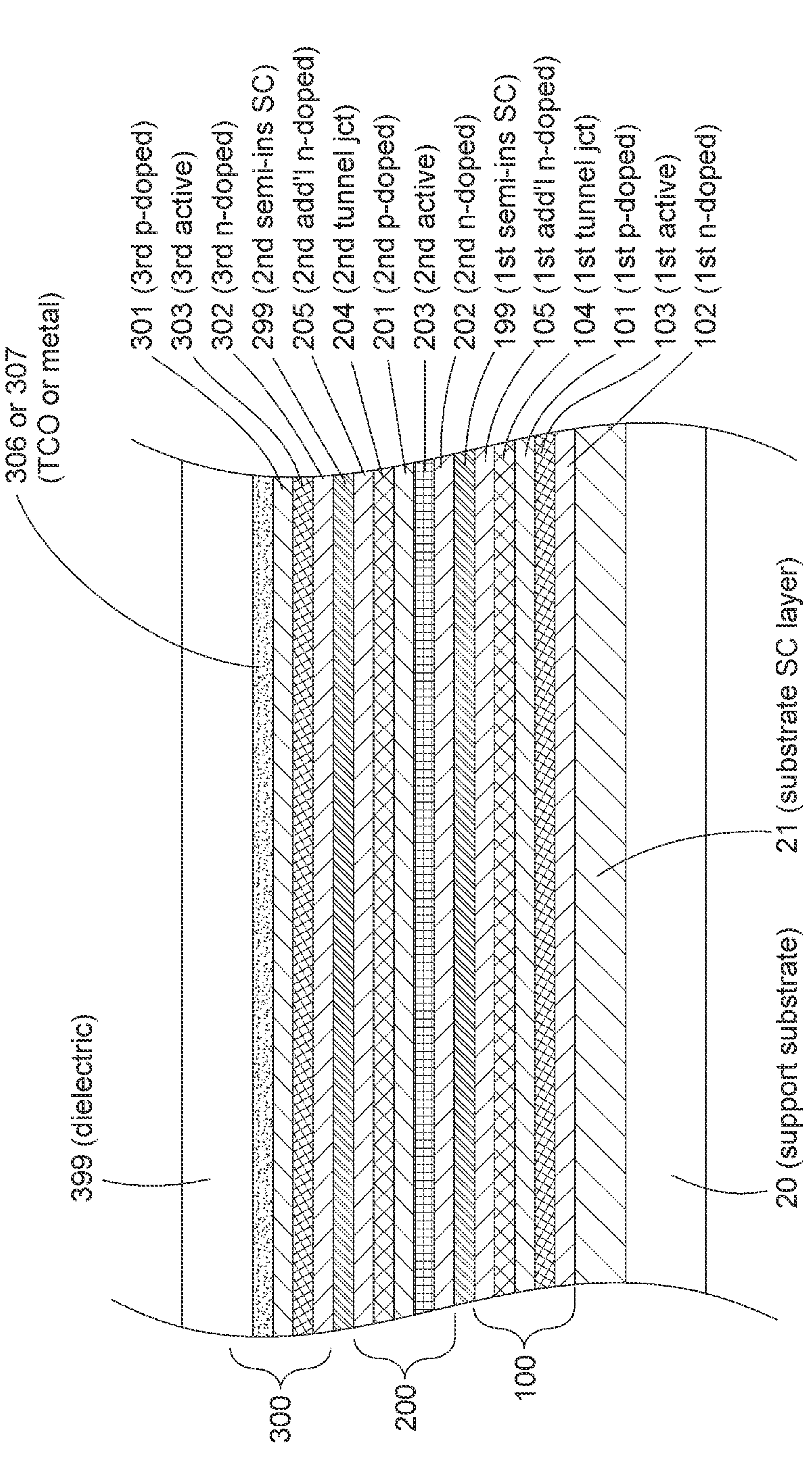

Examples of inventive layer sequences are illustrated schematically in FIGS. 2A and 2B; each example includes first, second, and third sets 100/200/300 of LED layers, first and second semi-insulating layers 199/299, and a dielectric layer 399. A semiconductor substrate layer 21 (e.g., undoped GaN or other suitable III-V semiconductor material) is formed (e.g., deposited or grown) on a support substrate 20 (e.g., sapphire or other sufficiently lattice-matched material). The material for the semiconductor substrate layer 21 can be chosen to provide a lattice-matched base onto which the remaining layers can be grown or deposited.

The LED layer first set 100 is formed on the semiconductor substrate layer 21. The first LED layer set 100 includes a first p-doped semiconductor layer 101, a first n-doped semiconductor layer 102, and a first light-emitting active layer 103 between them. The first active layer 103 emits light at a corresponding first nominal emission wavelength. A first tunnel junction layer 104 is positioned against the first p-doped semiconductor layer 101, and a first additional n-doped semiconductor layer 105 is positioned against the first tunnel junction layer 104. Any suitable semiconductor materials can be employed for the first LED layer set 100, e.g., various doped or undoped III-V materials or mixtures or alloys thereof. In some examples the first p-doped, n-doped, and additional n-doped layers 101/102/105 can include p-doped GaN, n-doped GaN, and n-doped GaN, respectively. The first active layer 103 and the first tunnel junction layer 104 can include corresponding III-nitride materials (doped or undoped) or mixtures or alloys thereof. The first active layer 103 can be suitably composed and arranged for emitting the desired first emission wavelength, e.g., as one or more quantum wells or including quantum dots. The first tunnel junction layer 104 can be suitably composed and arranged to permit current injected into the first additional n-doped semiconductor layer 105 to traverse the first tunnel junction layer 104 and enter the first p-doped semiconductor layer 101. Use of a tunnel junction layer and an additional n-doped semiconductor layer enables electrical contact to the p-doped semiconductor layer while maintaining lattice matching of the layer sequence for forming subsequent layers. Any one or more suitable growth, deposition, or other processes can be employed for forming the layers of the first LED layer set 100.

After the first LED layer set 100 is formed, a first semi-insulating semiconductor layer 199 is formed. The first semi-insulating semiconductor layer 199 serves to electrically isolate the first LED layer set 100 from the second LED layer set 200 (described below), so that those LED layer sets can be operated independently to emit light at their respective emission wavelengths. A suitably doped, lattice-matched semiconductor material is employed (e.g., carbon-doped GaN) instead of, e.g., a dielectric layer, so as to maintain lattice-matching of the layer structure for forming subsequent layers. Any one or more suitable growth, deposition, or other processes can be employed for forming the first semi-insulating semiconductor layer 199.

The second set 200 of LED layers is formed on the semi-insulating semiconductor layer 199. The second LED layer set 200 includes a second p-doped semiconductor layer 201, a second n-doped semiconductor layer 202, and a second light-emitting active layer 203 between them. The second active layer 203 emits light at a corresponding second nominal emission wavelength, different from the first nominal emission wavelength. A second tunnel junction layer 204 is positioned against the second p-doped semiconductor layer 201, and a second additional n-doped semiconductor layer 205 is positioned against the second tunnel junction layer 204. The layers of the second LED layer set 200 can be arranged as described above for the first LED layer set 100, and any suitable semiconductor materials can be employed for the second LED layer set 200, e.g., including those disclosed above for the first LED layer set 100. The second active layer 203 can be suitably composed and arranged for emitting the desired second emission wavelength, e.g., as one or more quantum wells or including quantum dots. Any one or more suitable growth, deposition, or other processes can be employed for forming each layer of the second LED layer set 200.

After the second LED layer set 200 is formed, a second semi-insulating semiconductor layer 299 is formed. The second semi-insulating semiconductor layer 299 serves to electrically isolate the second LED layer set 200 from the third LED layer set 300 (described below), so that those LED layer sets can be operated independently to emit light at their respective emission wavelengths. The second semi-insulating semiconductor layer 299 can be arranged in a manner similar to the semi-insulating semiconductor layer 199, using any suitable material (including those disclosed for layer 199). Any one or more suitable growth, deposition, or other processes can be employed for forming the first semi-insulating semiconductor layer 299.

The third set 300 of LED layers is formed on the semi-insulating semiconductor layer 299. The third LED layer set 300 includes a third p-doped semiconductor layer 301, a third n-doped semiconductor layer 302, and a third light-emitting active layer 303 between them. The third active layer 303 emits light at a corresponding third nominal emission wavelength, different from the first and second nominal emission wavelengths. A set of one or more electrode layers is positioned against, and is in electrical contact with, the third p-doped semiconductor layer 301. The layers 301/302/303 of the third LED layer set 300 can be arranged as described above for layers 101/102/103 of the first LED layer set 100, and any suitable semiconductor materials can be employed for those layers of the third LED layer set 300, e.g., including those disclosed above for the first LED layer set 100. The third active layer 303 can be suitably composed and arranged for emitting the desired third emission wavelength, e.g., as one or more quantum wells or including quantum dots. Any one or more suitable growth, deposition, or other processes can be employed for forming each of the layers 301/302/303 of the third LED layer set 300.

In some examples (e.g., as in FIG. 2A), the one or more electrode layers can include a third tunnel junction layer 304 positioned against the third p-doped semiconductor layer 301, and a third additional n-doped semiconductor layer 305 positioned against the third tunnel junction layer 304. The layers 304/305 of the third LED layer set 300 can be arranged as described above for layers 104/105 of the first LED layer set 100, and any suitable semiconductor materials can be employed for those layers of the third LED layer set 300, e.g., including those disclosed above for the first LED layer set 100. Any one or more suitable growth, deposition, or other processes can be employed for forming each of the layers 304/305 of the third LED layer set 300.

In some examples (e.g., as in FIG. 2B), the one or more electrode layers of the third LED layer set 300 can include one or more transparent conductive oxide (TCO) layers 306 or one or more metal layers 307. In some examples any one or more suitable TCO materials can be employed, e.g., indium tin oxide (ITO) or indium zinc oxide (IZO). The TCO layer 306 can be in direct contact with the third p-doped semiconductor layer 301 so as to deliver current to that layer. In some examples one or more suitable metal layers (e.g., gold, silver, copper, or aluminum) can be employed in direct contact with the third p-doped semiconductor layer 301 so as to deliver current to that layer (e.g., through ohmic contact). Any one or more suitable growth, deposition, or other processes can be employed for forming the TCO layer 306 or the metal layer 307 of the third LED layer set 300. The TCO or metal layers 306/307 can be suitably employed in some examples wherein no further lattice-matched layers are to be formed.

The dielectric layer 399 is grown or deposited on the third set 300 of LED layers, and can comprise any suitable dielectric material, e.g., one or more metal or semiconductor oxides, nitrides, or oxynitrides, or mixtures thereof. Any one or more suitable growth, deposition, or other processes can be employed for forming the dielectric layer 399.

Figure 3A:
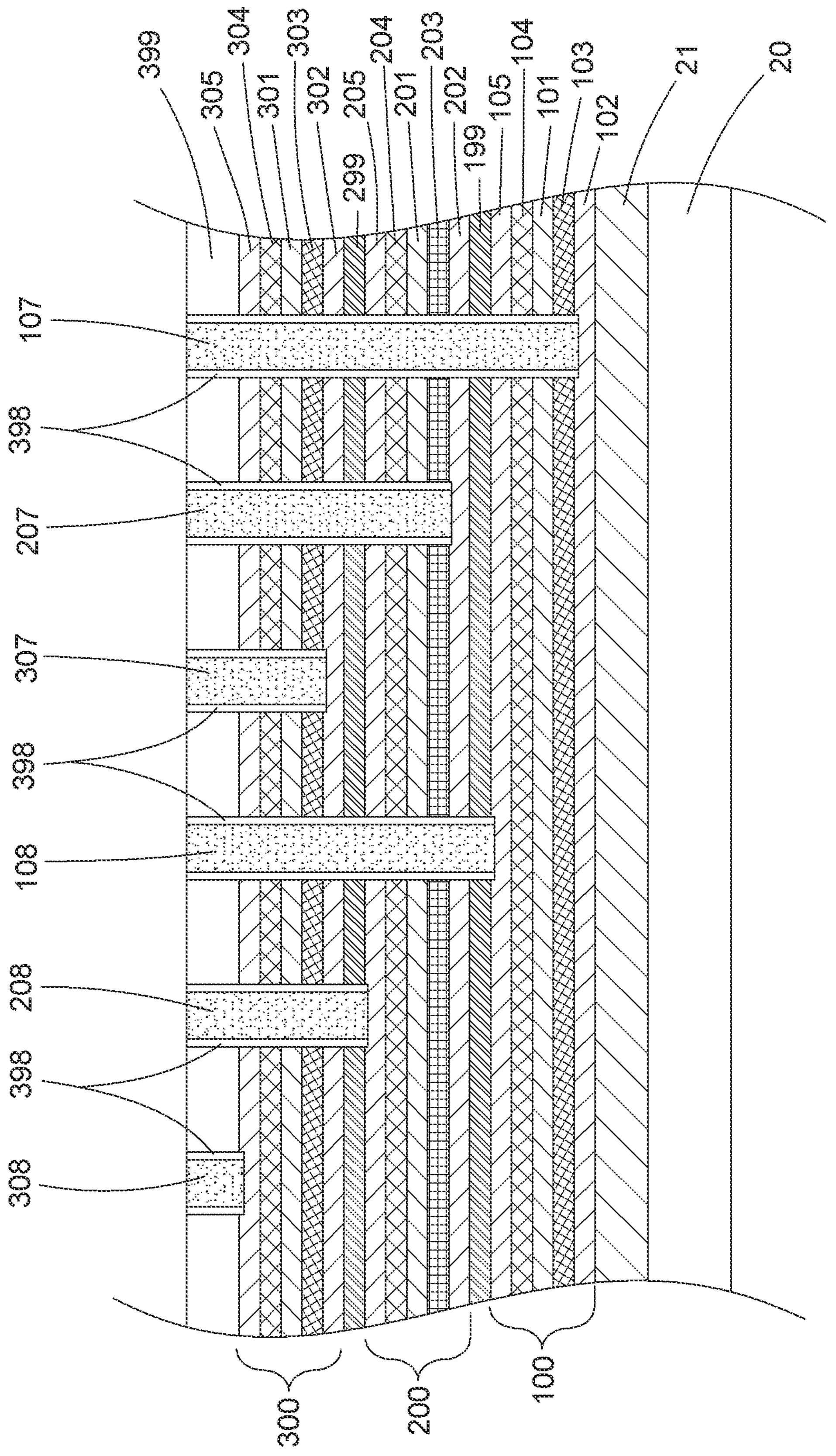
FIG. 3A illustrates schematically an example of an inventive polychromic LED stack with independent anode and cathode contacts.
Figure 3B:
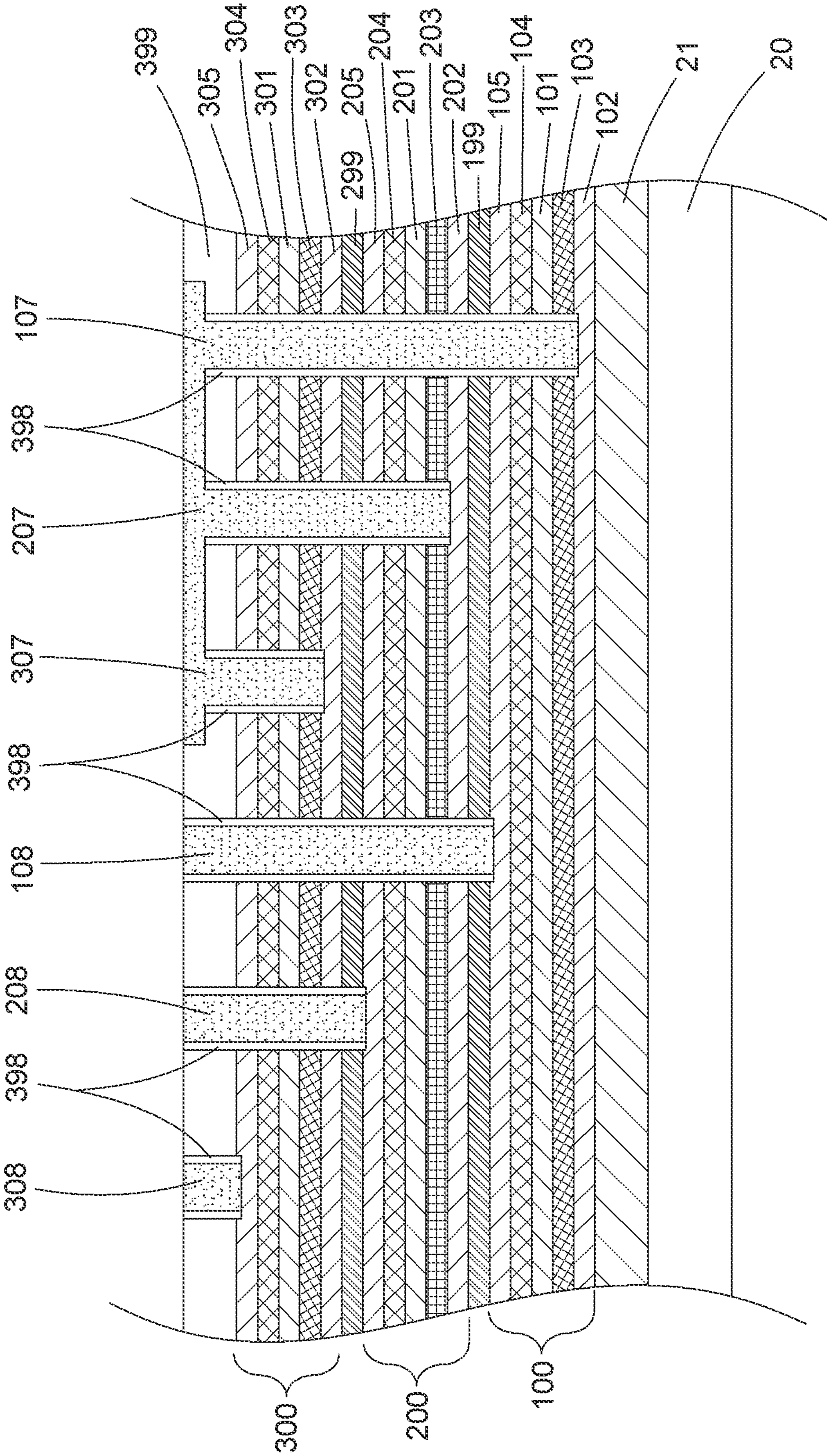
FIG. 3B illustrates schematically an example of an inventive polychromic LED stack with independent anode contacts and a common cathode contact.
Figure 3C:
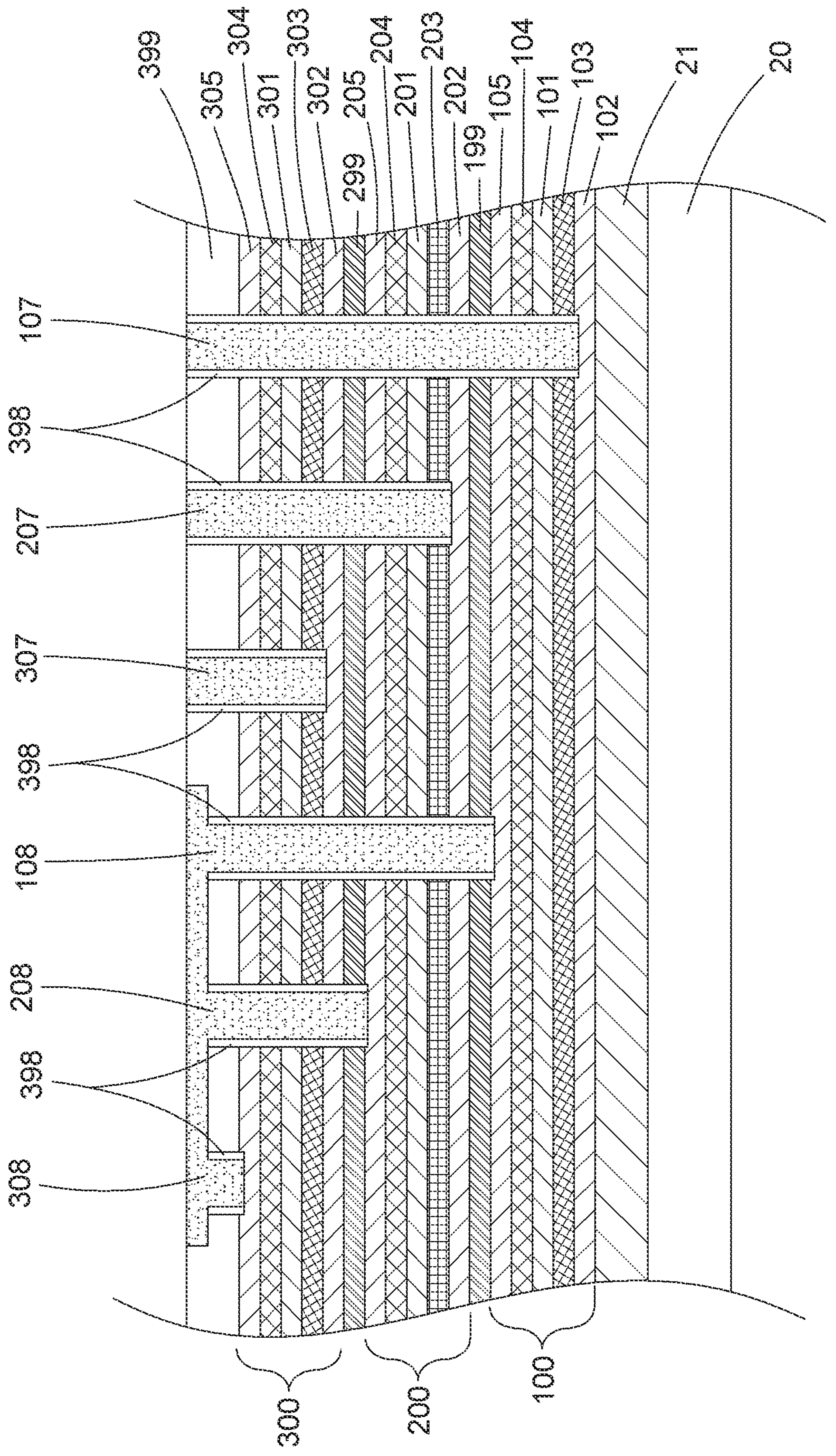
FIG. 3C illustrates schematically an example of an inventive polychromic LED stack with a common anode contact and independent cathode contacts.

The layer structure described above can used to form one or more polychromic LED stacks by adding suitably arranged anode and cathode contacts. Examples are illustrated schematically in FIGS. 3A-3C, in which the third LED layer set 300 includes the tunnel junction layer 304 and the third additional n-doped semiconductor layer 305; analogous contact arrangements can be implemented in examples wherein the third LED layer set 300 includes a TCO layer 306 or a metal layer 307. In the examples shown, corresponding first, second, and third cathode contacts 107/207/307 can be formed that are each in electrical contact with the first, second, and third n-doped semiconductor layers 102/202/302, respectively. Corresponding first, second, and third anode contacts 108/208/308 can be formed that are each in electrical contact with the first, second, and third additional n-doped semiconductor layers 105/205/305, respectively, (and so effectively in electrical contact with the p-doped semiconductor layers 101/201/301, respectively, through the corresponding tunnel junction layers 104/204/304). The anode and cathode contacts extend past or through the dielectric layer 399.

The contacts can be arranged so that each of the three sets 100/200/300 of LED layers can be operated independently of one another to emit light at its corresponding emission wavelength. In some examples (e.g., as in FIG. 3A), all six contacts are electrically isolated from one another; in some examples (e.g., as in FIG. 3B), the three cathode contacts 107/207/307 are connected together electrically to form a common cathode contact; in some examples (e.g., as in FIG. 3C), the three anode contacts 108/208/308 are connected together electrically to form a common anode contact. The first cathode contact 107 and the first anode contact 108 (i.e., the first LED contacts) can extend past or through the dielectric layer 399, the third LED layer set 300, and the second LED layer set 200, and can be electrically insulated from the second and third LED layer sets 200/300 (e.g., by dielectric material 398). The second cathode contact 207 and the second anode contact 208 (i.e., the second LED contacts) can extend past or through the dielectric layer 399 and the third LED layer set 300, and can be electrically isolated from the third LED layer set 300 (e.g., by dielectric material 398). The third cathode contact 307 and the third anode contact 308 (i.e., the third LED contacts) can extend past or through the dielectric layer 399.

In some examples one or more or all of the LED contacts can be positioned around a periphery of the LED stack, each such contact being arranged as a conductive sidewall layer that extends past the dielectric layer 399 and one or more of the layers of the LED stacks 100/200/300, making electrical contact with the corresponding semiconductor layer thereof at the periphery of that LED layer. In some examples one or more or all of the LED contacts can each be arranged as a discrete, circumscribed conductive via that extends through the dielectric layer 399 and one or more of the layers of the LED stacks 100/200/300 to make electrical contact with a corresponding semiconductor layer of one of those sets of LED layers.

In some examples (e.g., the specific example of FIGS. 4A-4M, 5A-5M, 6A, 6B, and 7A-7C), (i) each of the third LED contacts 307/308 can be arranged as a discrete, circumscribed conductive via that extends through the dielectric layer 399 into the third LED layer set 300; (ii) each of the second LED contacts 207/208 can be arranged as a discrete, circumscribed conductive via that extends through the dielectric layer 399 and the third LED layer set 300 and into the second LED layer set 200, and that is electrically insulated from the third LED layer set 300; and (iii) each of the first anode contacts 108, or each of the first cathode contacts 107, can be arranged as a discrete, circumscribed conductive via that extends through the dielectric layer 399 and the second and third LED layer sets 200/300, and into the first LED layer set 100, and that is electrically insulated from the second and third LED layer sets 200/300. In some of those examples, each of the first cathode and anode contacts 107/108 (i.e., the first LED contacts) can be arranged as a discrete, circumscribed conductive via that extends through the dielectric layer 399 and the second and third LED layer sets 200/300, and into the first LED layer set 100, and that is electrically insulated from the second and third LED layer sets 200/300. In some other of those examples (e.g., the specific example of FIGS. 4A-4M and 5A-5M), each of either the first cathode or first anode contacts 107/108 can be arranged as circumscribed vias, while each of the other type of contacts (i.e., the ones not arranged as circumscribed vias) can be arranged as a conductive sidewall layer that extends through the dielectric layer 399, past the second and third LED layer sets 200/300, and into the first LED layer set 100, and that is electrically insulated from the second and third LED layer sets 200/300. In the example of FIGS. 4A-4M and 5A-5M, the first anode contacts 108 are arranged as circumscribed vias and the first cathode contacts 107 are arranged as conductive sidewall layers.

A first operating current passing between the first cathode contact 107 and the first anode contact 108, through the first LED layer set 100, results in emission of light at the first nominal emission wavelength through carrier recombination at the first active layer 103. A second operating current passing between the second cathode contact 207 and the second anode contact 208, through the second LED layer set 200, results in emission of light at the second nominal emission wavelength through carrier recombination at the second active layer 203. A third operating current passing between the third cathode contact 307 and the third anode contact 308, through the third LED layer set 300, results in emission of light at the third nominal emission wavelength through carrier recombination at the third active layer 303. The first and second semi-insulating semiconductor layers 199 and 299, and electrical insulation various of the contacts from various of the LED layers, enables independent operation of the LED layer sets 100/200/300 of the polychromic LED stack, and corresponding independent emission of light at one or more or all of the first, second, or third nominal emission wavelengths. A suitably arranged control circuit can be connected to the contacts to deliver the operating currents in any suitable combination of relative magnitudes.

Any set of first, second, and third emission wavelengths can be employed. In some examples the first, second, and third emission wavelengths can include a blue emission wavelength, a green emission wavelength, and a red emission wavelength. In the examples shown the first emission wavelength is blue, the second emission wavelength is green, and the third emission wavelength is red; other wavelengths can be employed. In some examples the blue, green, and red emission wavelengths can define a color gamut that encompasses at least an sRGB color gamut. Different colors within the color gamut can be produced by each polychromic LED stack 15 by applying corresponding operating currents of different relative magnitudes to the first, second, and third LED contacts. In some examples each polychromic LED stack 15 can emit white light by application of a suitable combination of operating current magnitudes to the first, second, and third LED contacts.

In some examples multiple polychromic LED stacks, as described above, can be arranged as an array (e.g., polychromic LED stacks 15 of the array 10 of FIG. 1). Each polychromic LED of such an array can be operable independently of at least one other polychromic LED of the array. In some examples individual polychromic LEDs of the array, or groups of polychromic LEDs of the array, can be operable independently of one another, so that the array is arranged as and can be used as a display.

In some examples, to form an array 10 of polychromic LEDs 15, trenches 13 can be formed in the layer structure described above (e.g., by etching or other spatially selective technique for material processing) to separate the LEDs 15 of the array from one another. The trenches 13 can extend through the second and third LED layer sets 200/300 and at least some LED layers of the first set 100, separating each of those layers into discrete areal segments corresponding to corresponding LEDs 15 of the array 10. In some examples the trenches 13 can be at least partially filled with one or more reflective, scattering, or absorptive light barriers. In some examples the trenches can be at least partially filled by one or more electrically conductive sidewall layers acting as one or more of the LED contacts; in some such examples the electrically conductive sidewall layers can also act as light barriers or sidewall reflectors.

Figure 4A:
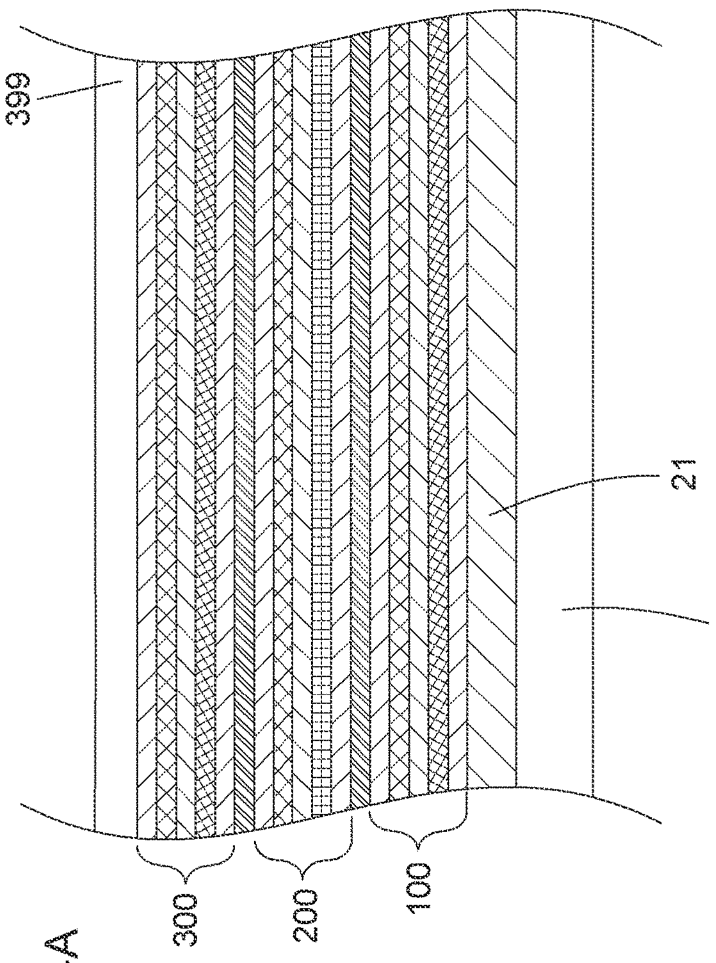
FIGS. 4A through 4M are cross-sectional views schematically illustrating an example fabrication sequence of an array of polychromic LED stacks; one complete LED stack and portions of two adjacent LED stacks are shown.
Figure 5A:
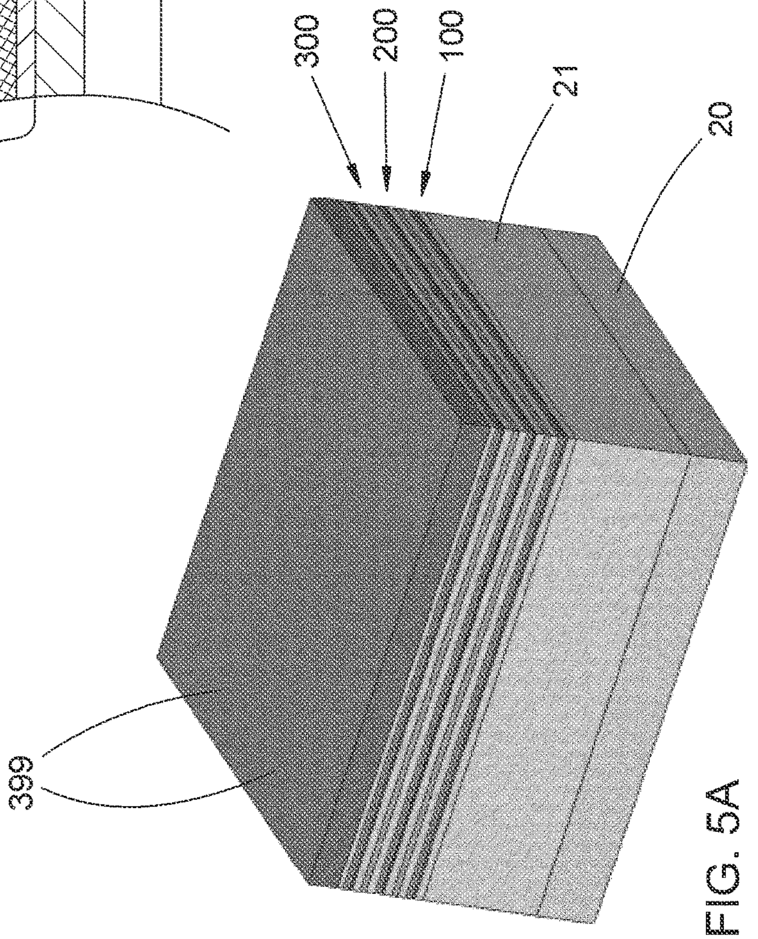
FIGS. 5A through 5M are perspective views (from the contact side) schematically illustrating the example fabrication sequence of FIGS. 4A through 4M; a 3×3 portion is shown of an array of polychromic LED stacks.
Figure 4B:
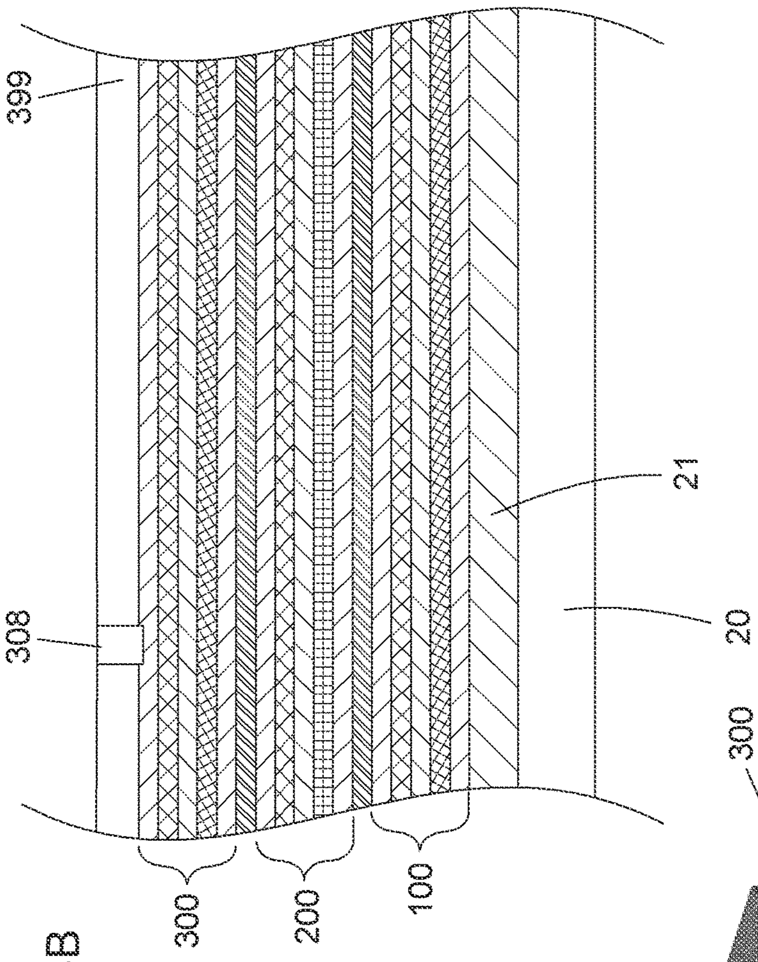
Figure 5B:
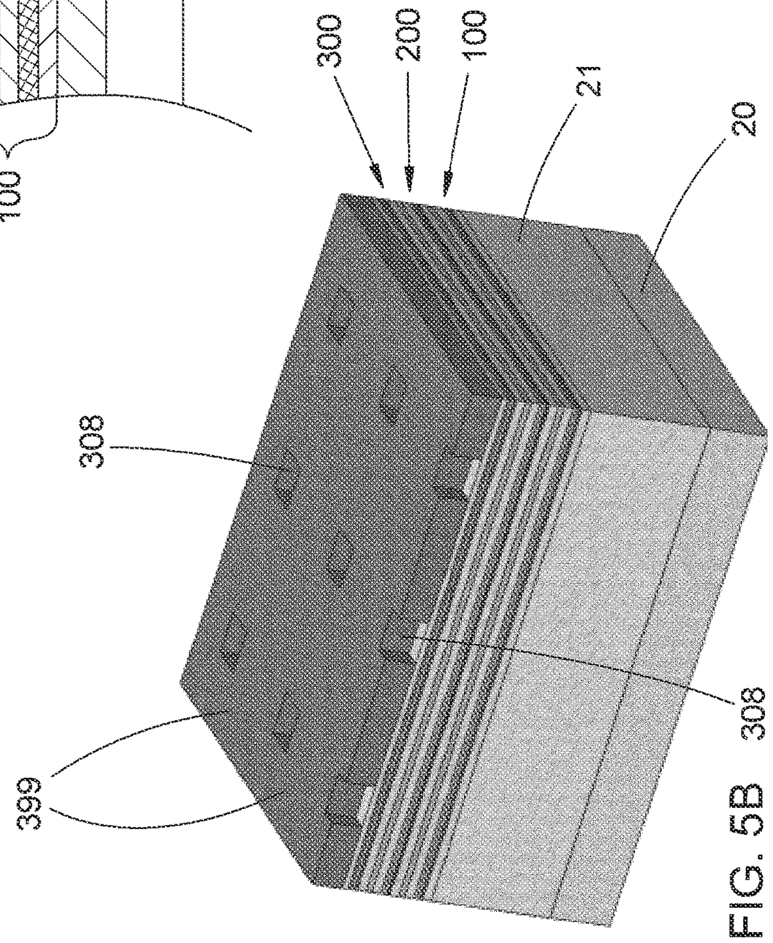
Figure 4C:
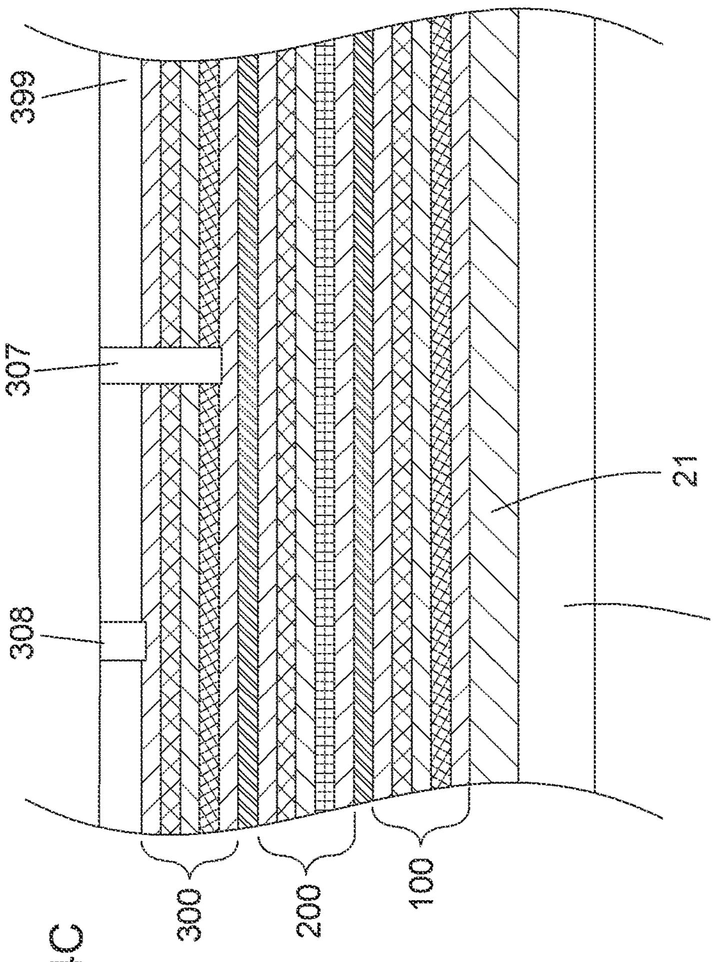
Figure 5C:
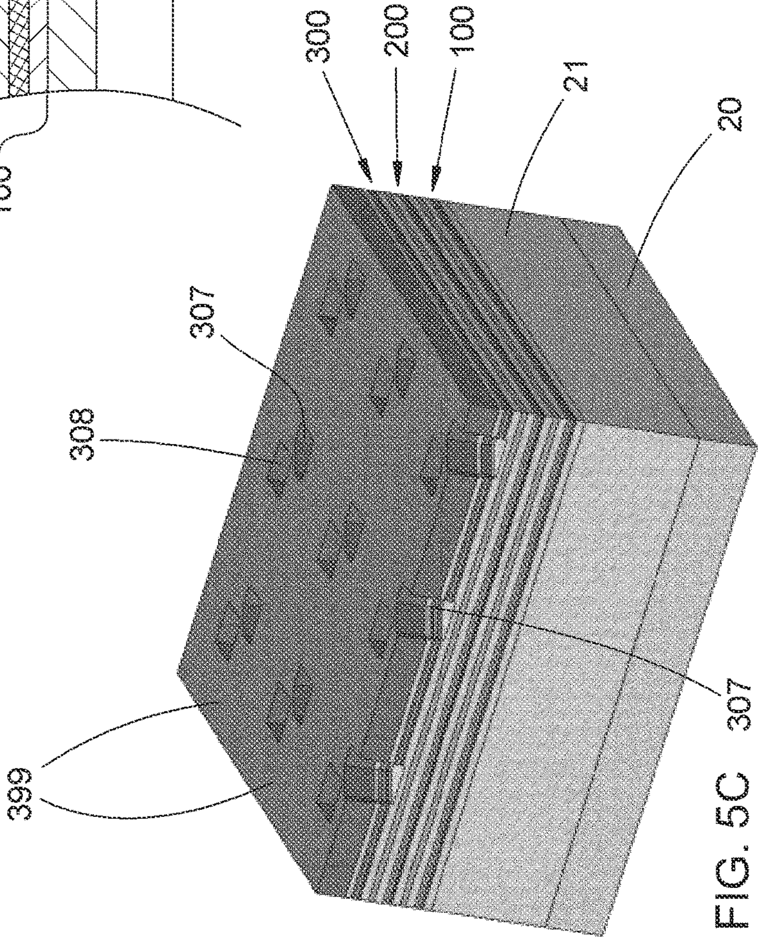
Figure 4D:
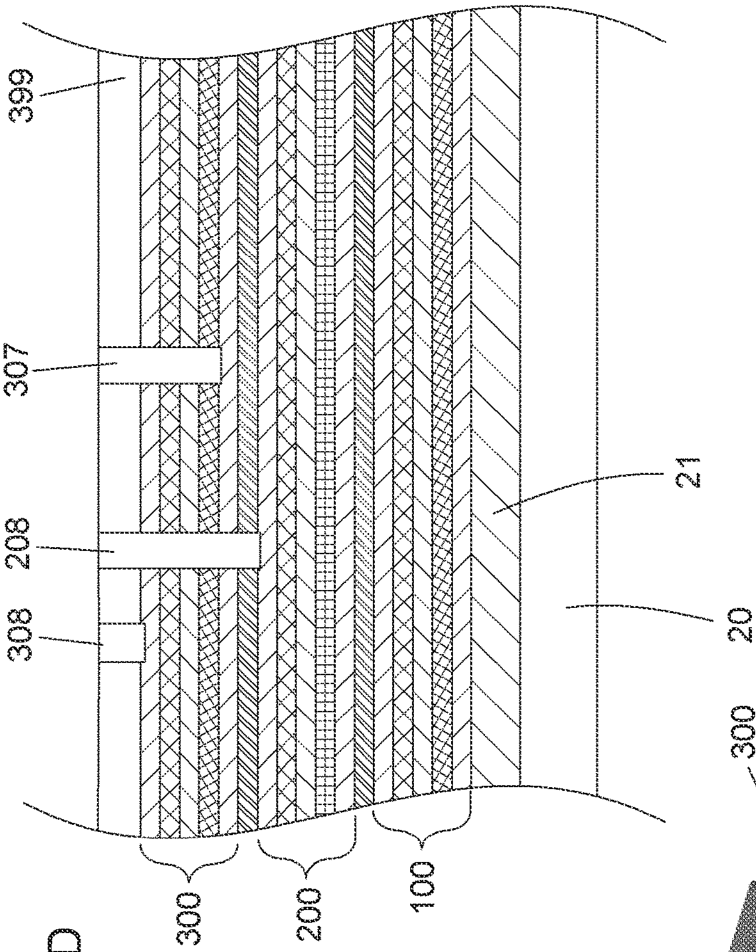
Figure 5D:
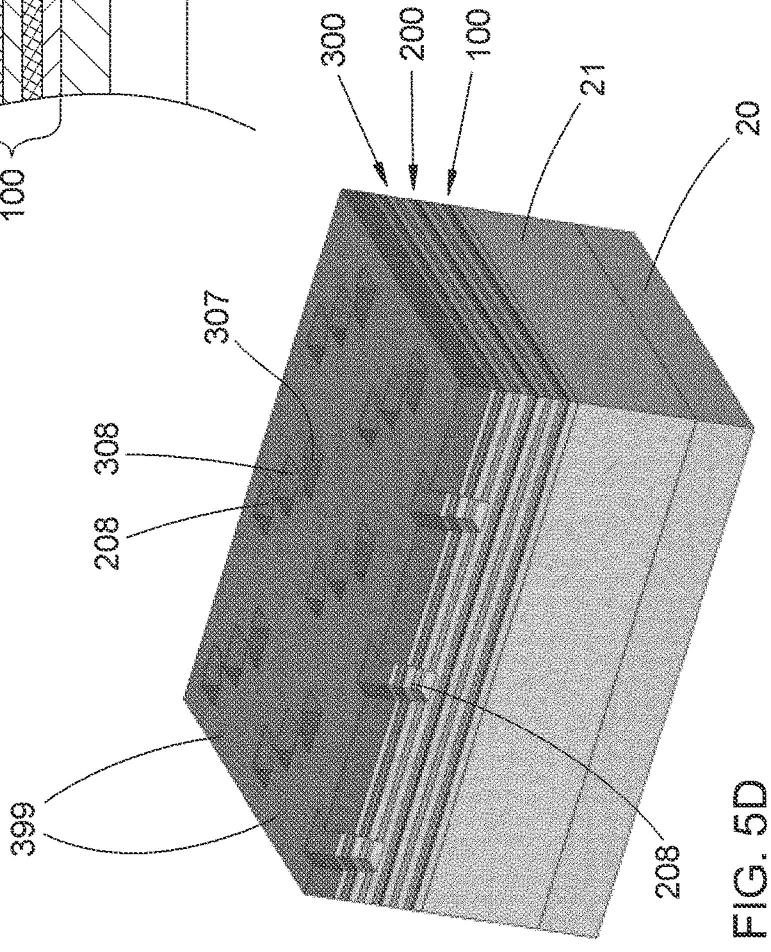
Figure 4E:
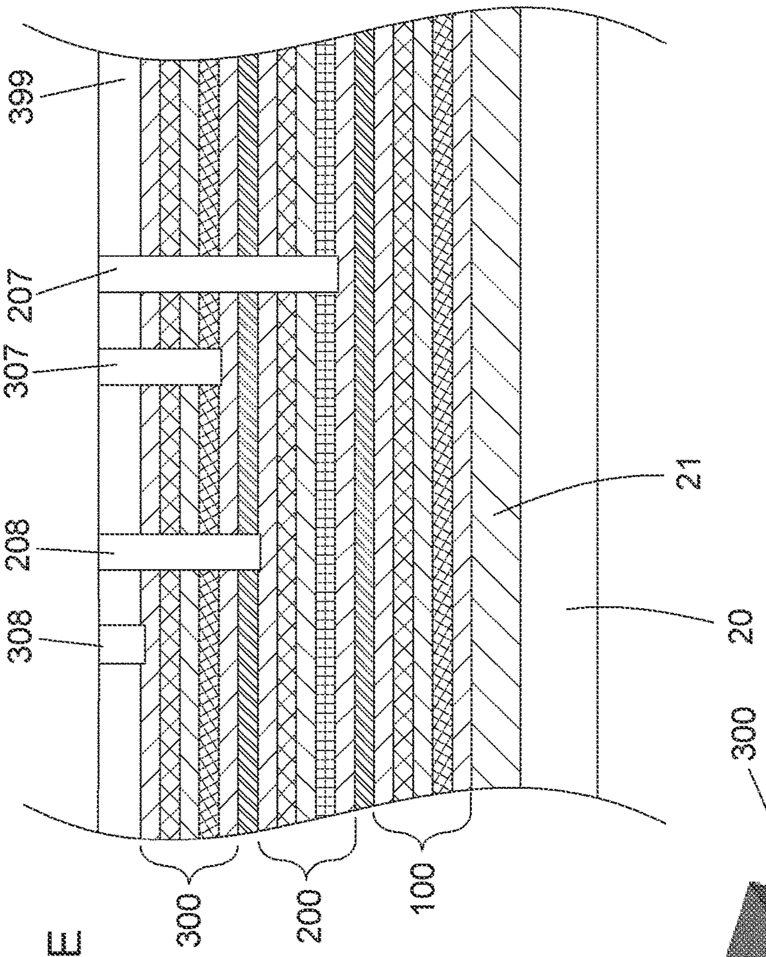
Figure 5E:
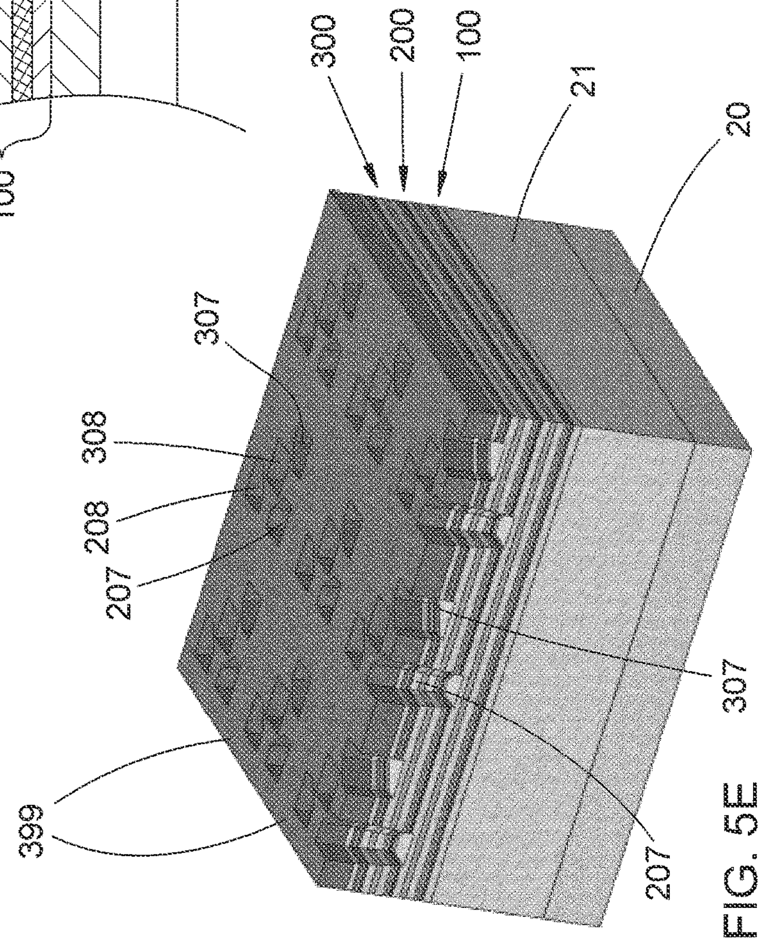
Figure 4F:
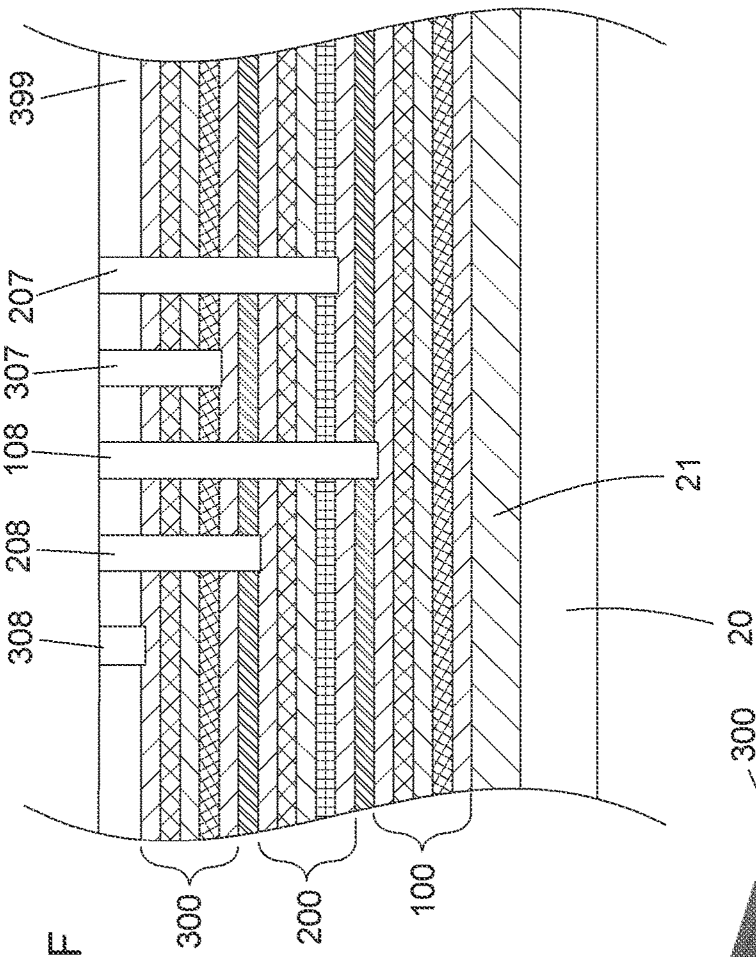
Figure 5F:
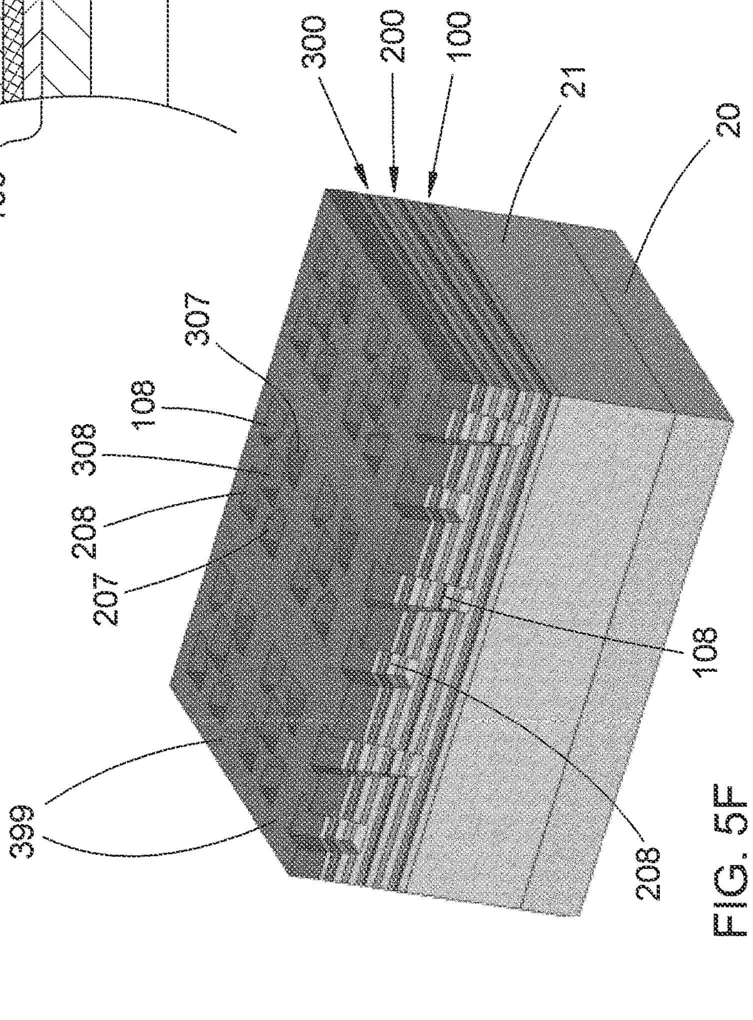
Figure 4G:
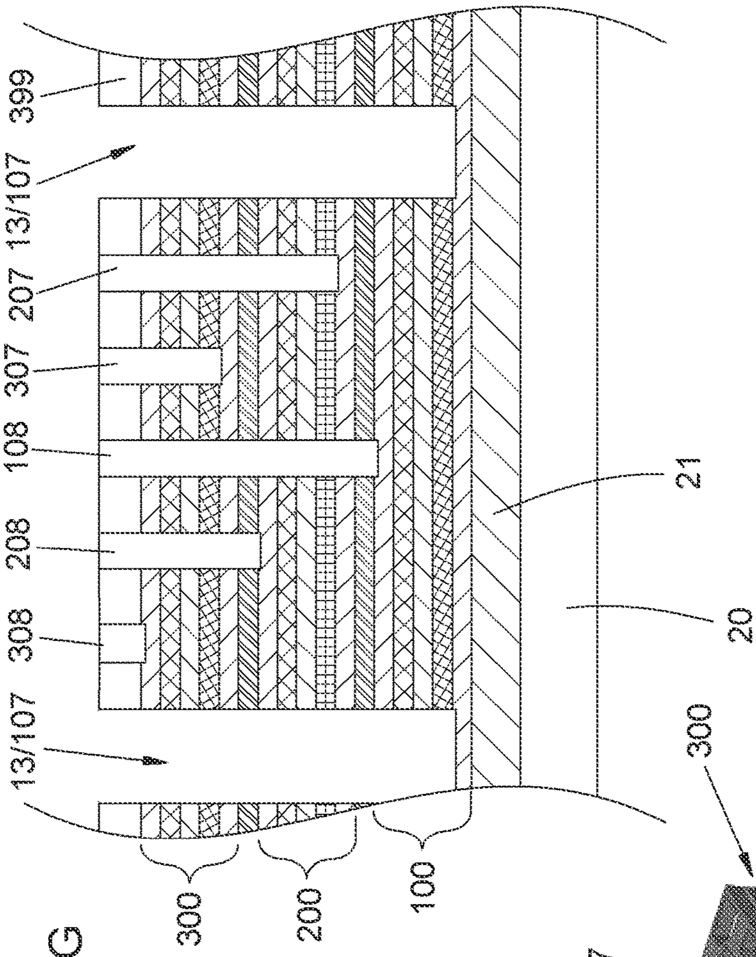
Figure 5G:
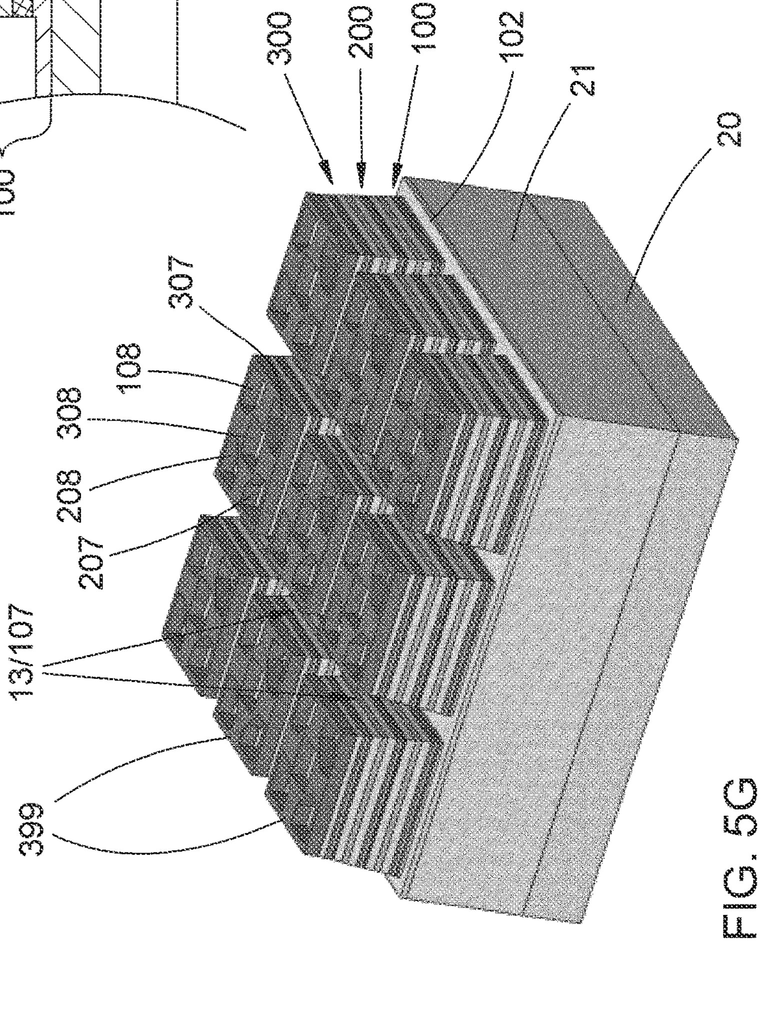
Figure 4H:
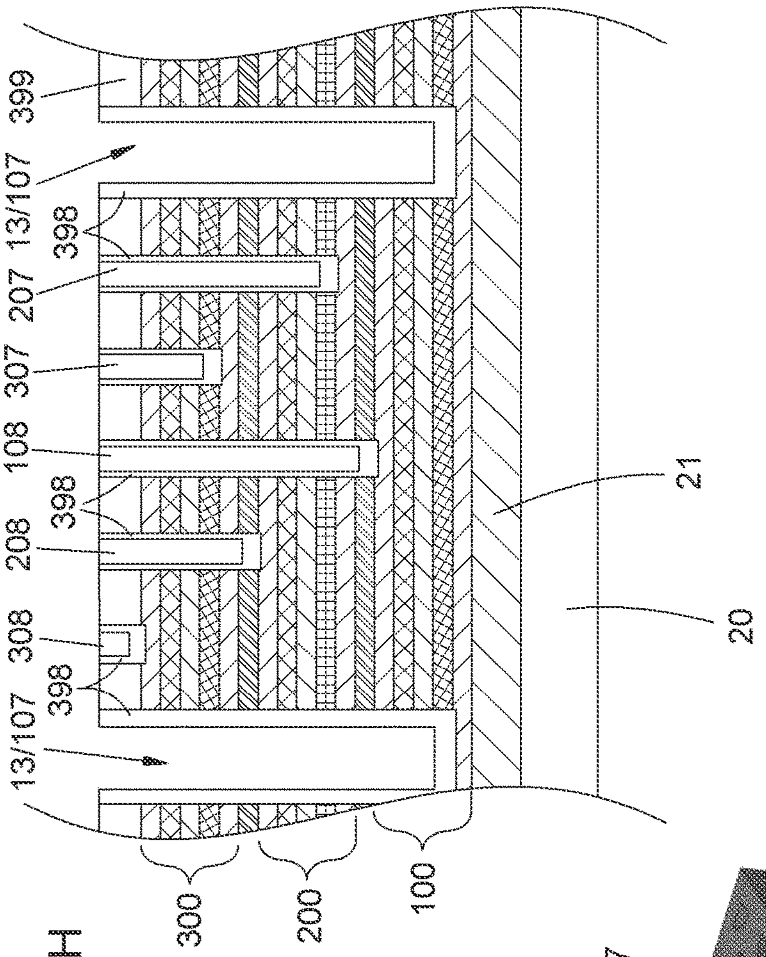
Figure 5H:
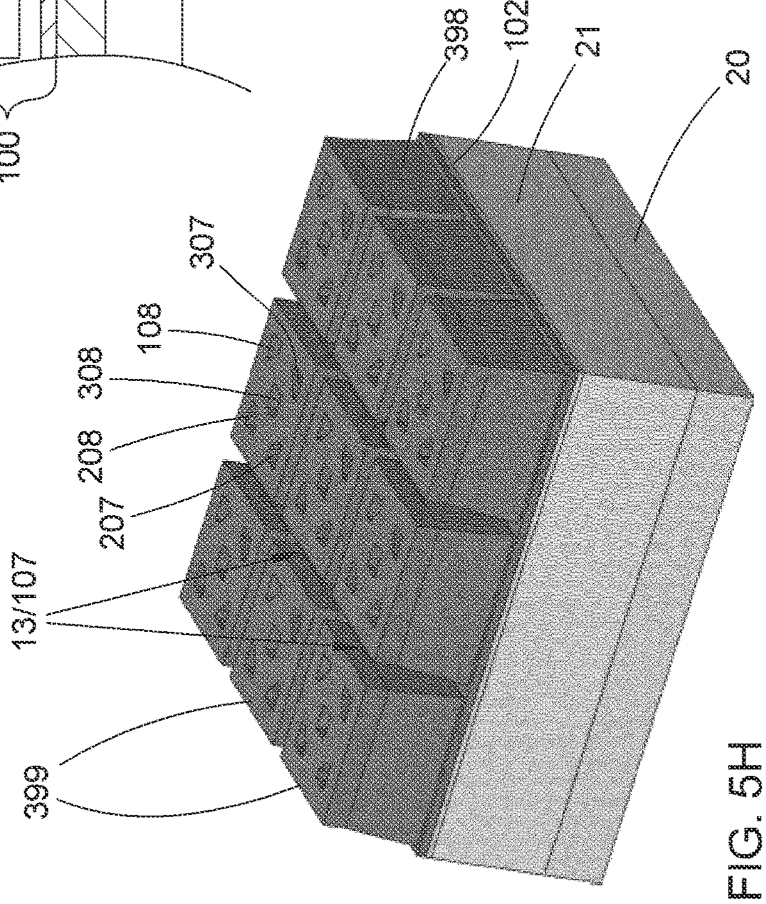

An example of a fabrication sequence, for forming an array 10 of polychromic LED stacks 15, is illustrated schematically in FIGS. 4A-4M and 5A-5M. The example fabrication sequence begins with the layer structure of FIG. 2A, and yields the contact arrangement of FIG. 3A; analogous fabrication sequences can be applied to the layer structure of FIG. 2B, or to yield the contact arrangements of FIG. 3B or 3C. Note that for illustrative purposes all holes or contacts present at a given step are shown in the cross-sections of FIGS. 4A-4M, even if those would not necessarily fall along a common section plane. FIGS. 4A and 5A show the inventive layer sequence of FIG. 2A on semiconductor substrate layer 21 (e.g., undoped GaN) on a support wafer 20 (e.g., sapphire). FIGS. 4B-4F and 5B-5F show a sequence of masked etch steps to form circumscribed holes through the dielectric layer 399 into the third additional n-doped layer 305 (FIGS. 4B/5B), into the third n-doped layer 302 (FIGS. 4C/5C), into the second additional n-doped layer 205 (FIGS. 4D/5D), into the second n-doped layer 202 (FIGS. 4E/5E), and into the first additional n-doped layer 105 (FIGS. 4F/5F). Trenches 13 are etched to define discrete polychromic LED stacks (FIGS. 4G/5G). An annealing step can be performed at this point in the fabrication sequence, or at another suitable point in the fabrication sequence, to activate the tunnel junction layers 104/204/304. Note that in the example shown the trenches extend only partly through the first n-doped layer 102, so that the first n-doped layers 102 of multiple LED stacks 15 of the array 10 are continuous with one another across the array (i.e., the first n-doped layers 102 of all the polychromic stacks are connected as a common cathode for their corresponding first LED layer sets 100; such an arrangement still permits independent operation of the polychromic LED stacks and independent operation of the LED layer sets within each polychromic LED stack). Other arrangements can be employed in which the trenches 13 extend entirely through the first n-doped layer 102, so that those layers of each LED stack 15 are separated from one another.

Figure 4I:
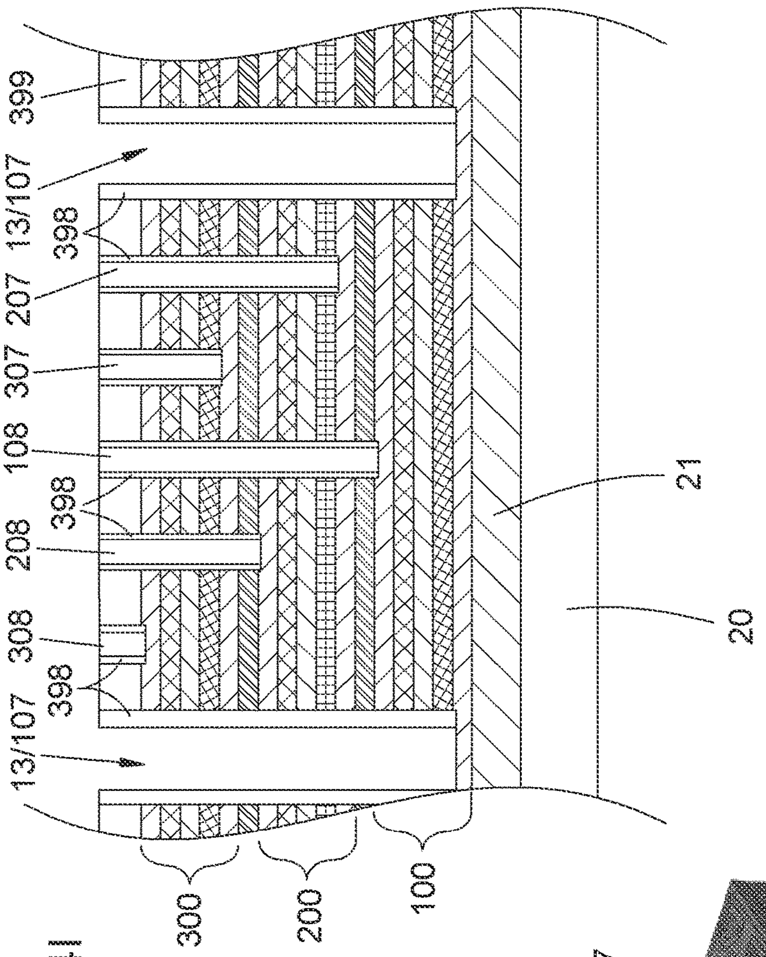
Figure 5I:
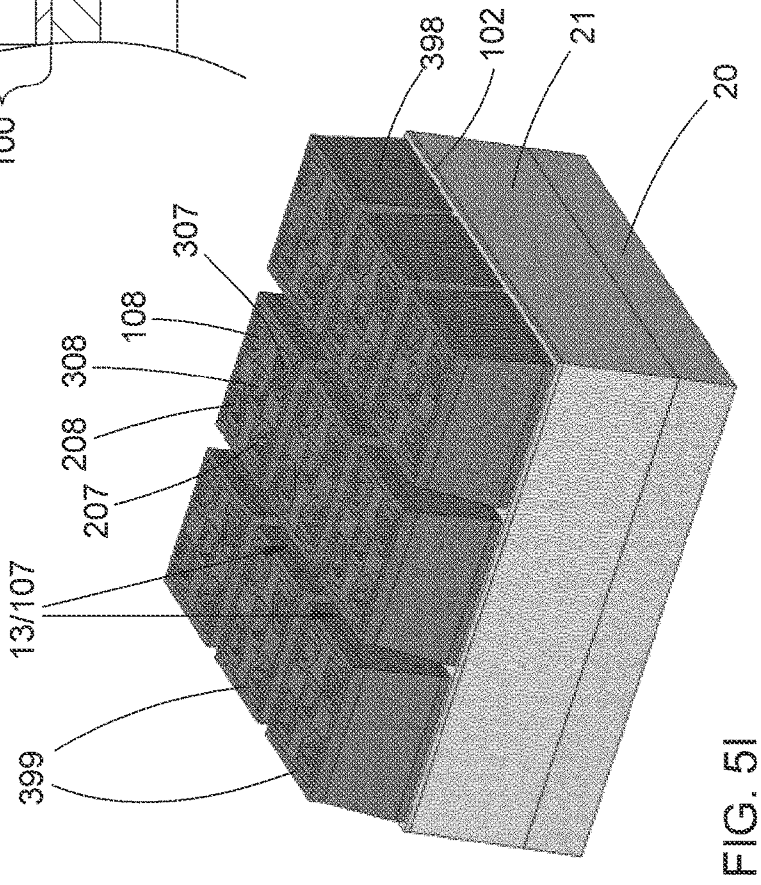
Figure 4J:
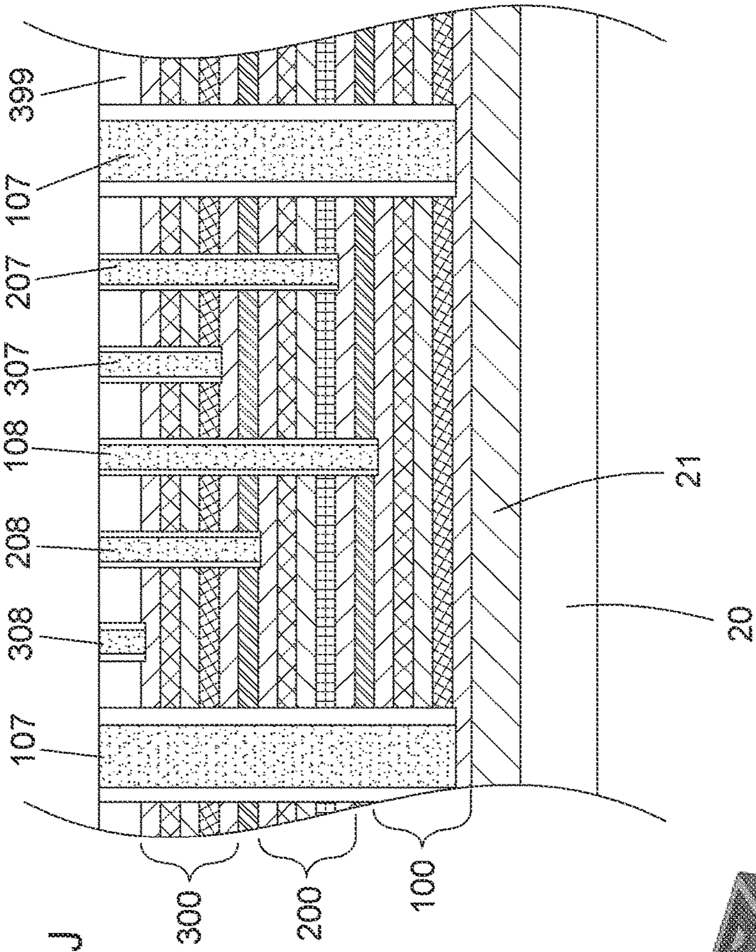
Figure 5J:
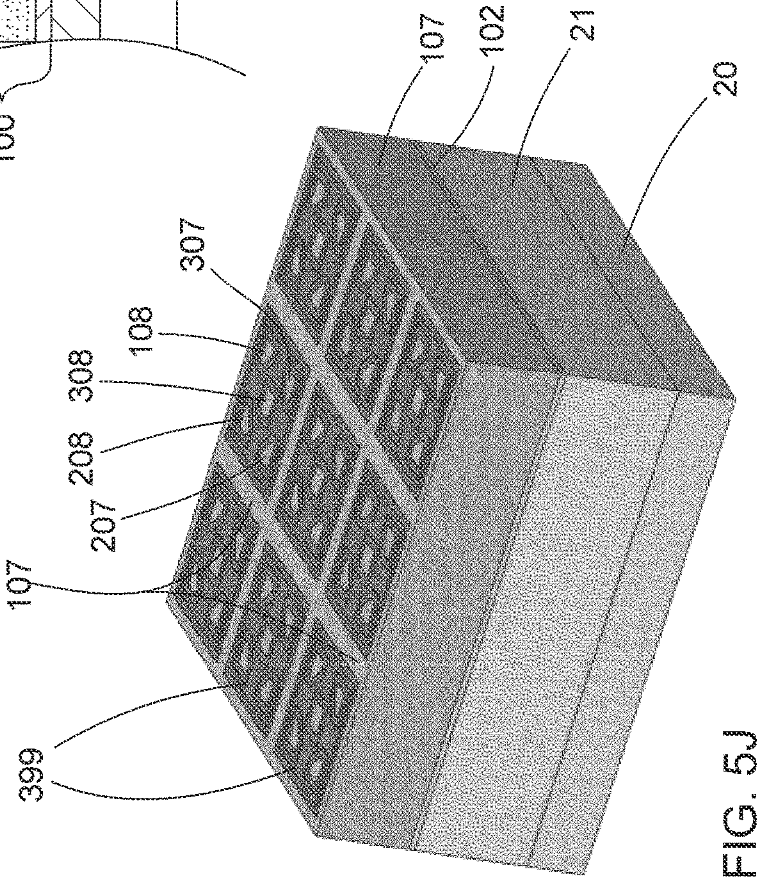
Figure 4K:
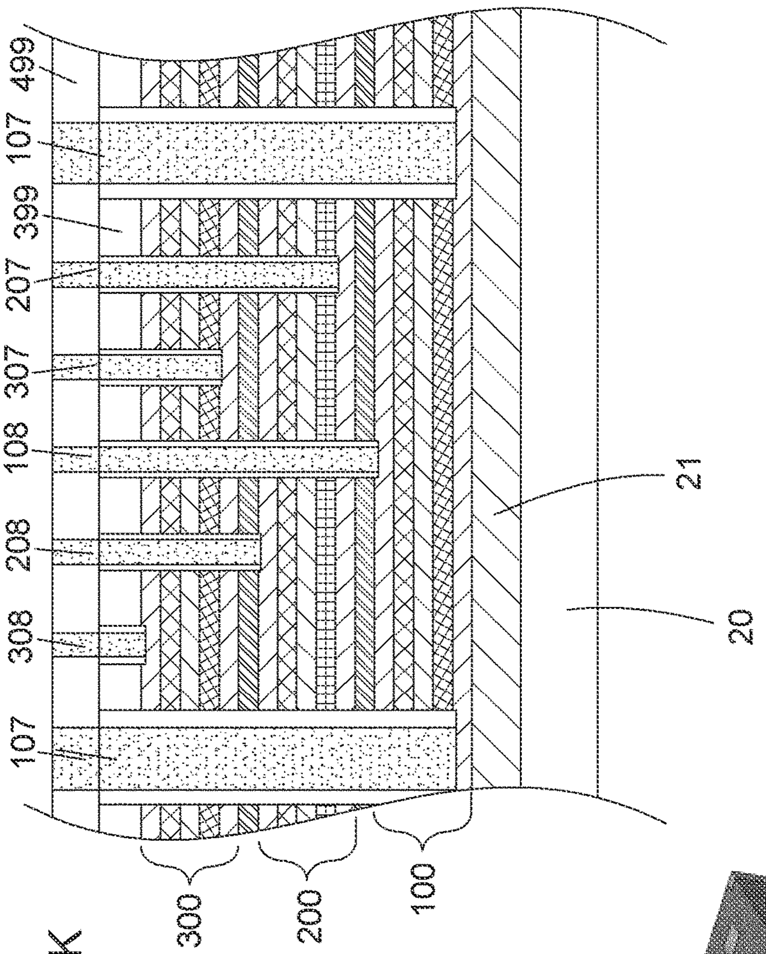
Figure 5K:
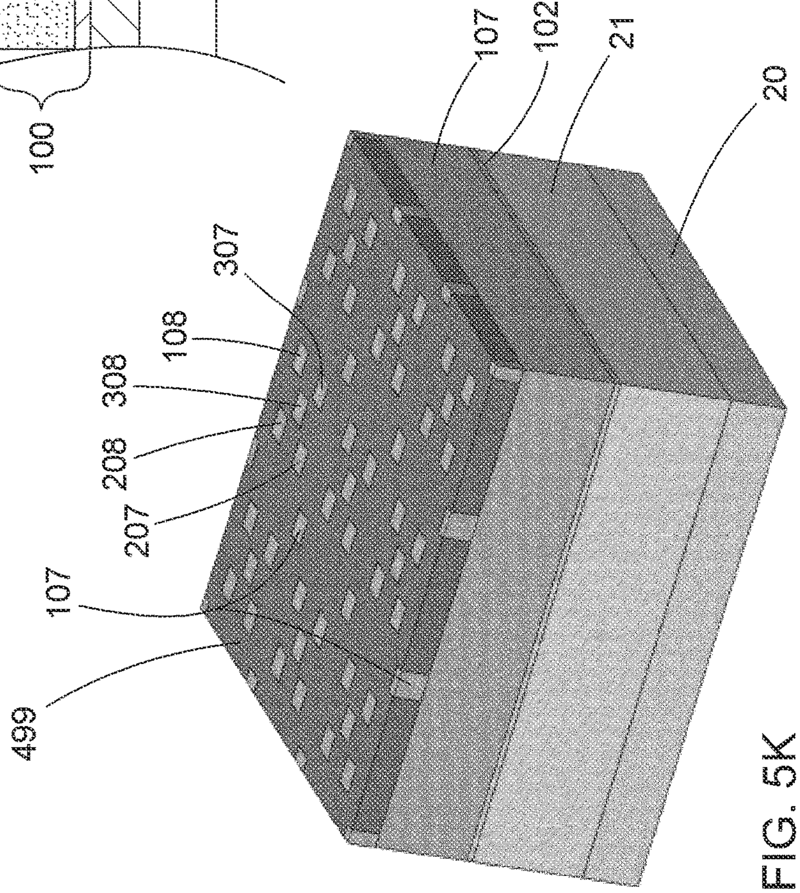
Figure 4L:
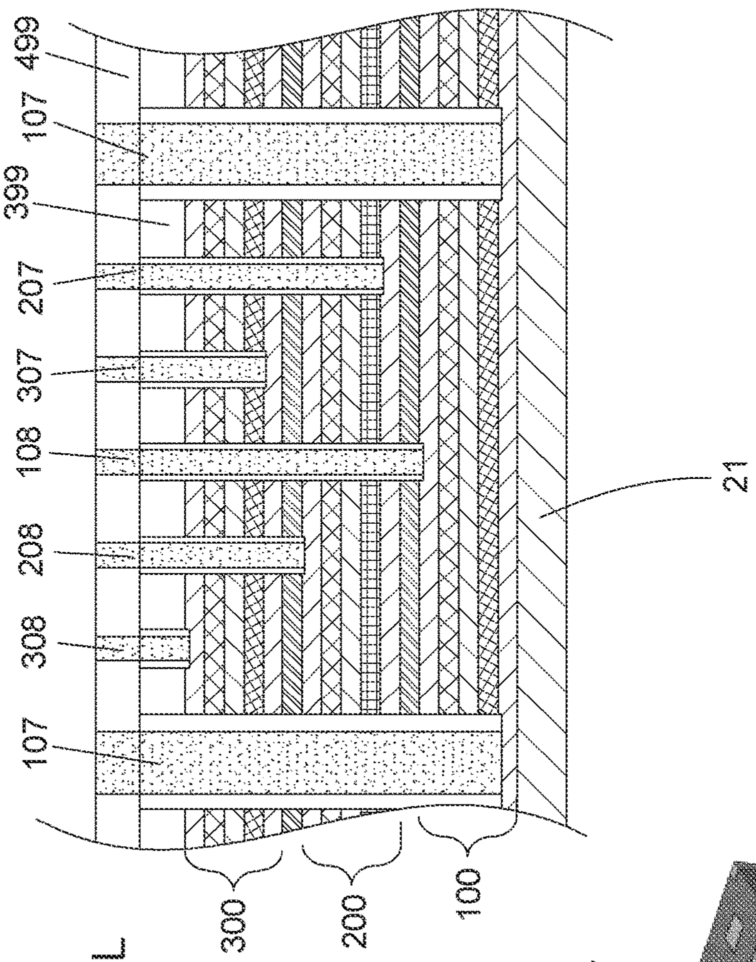
Figure 5L:
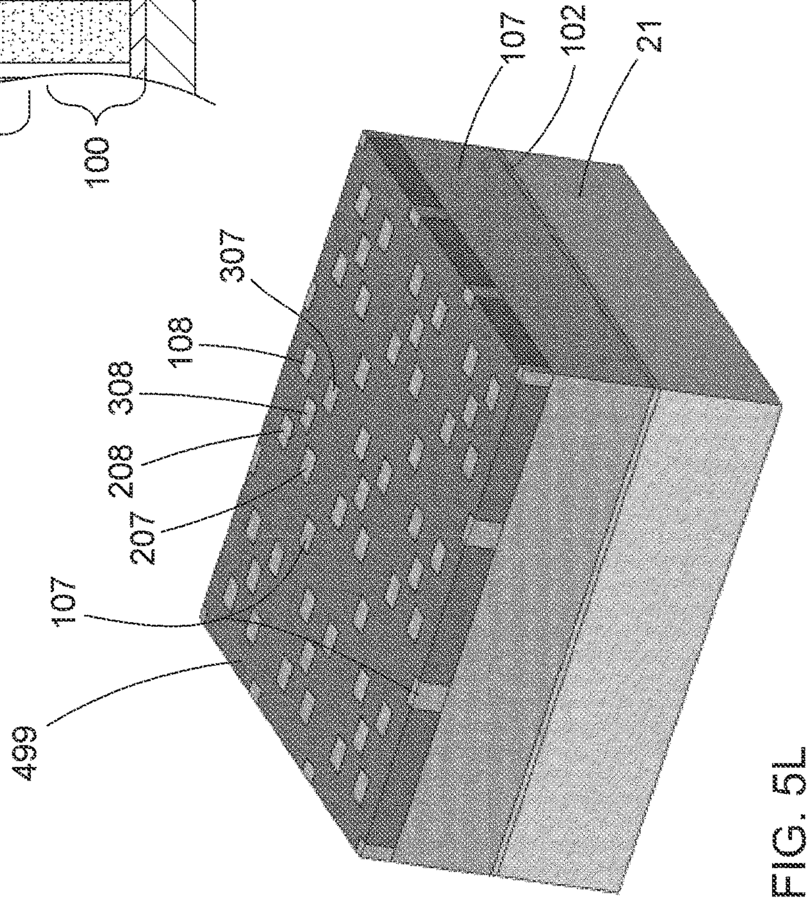
Figure 4M:
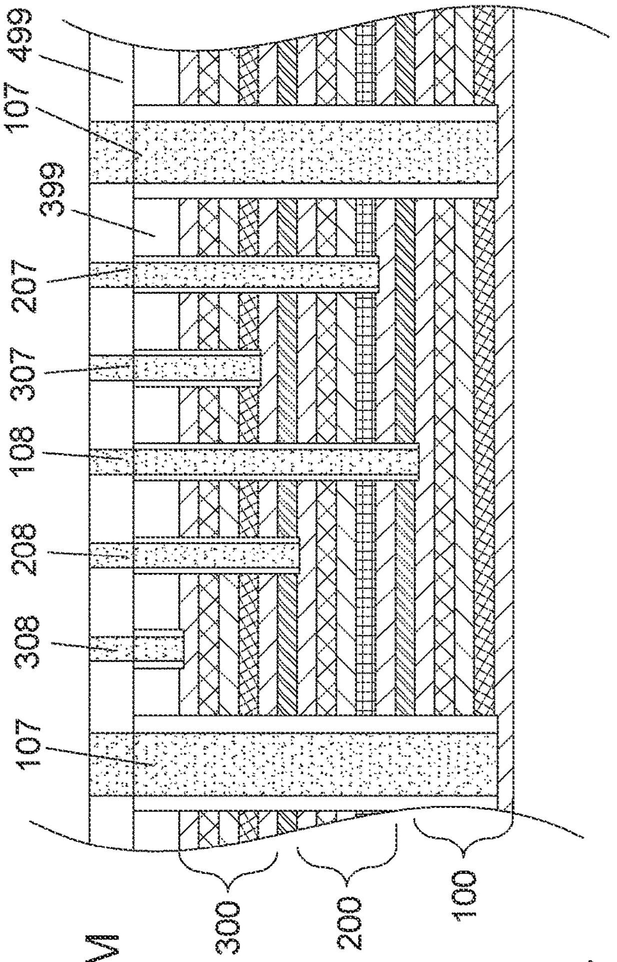
Figure 5M:
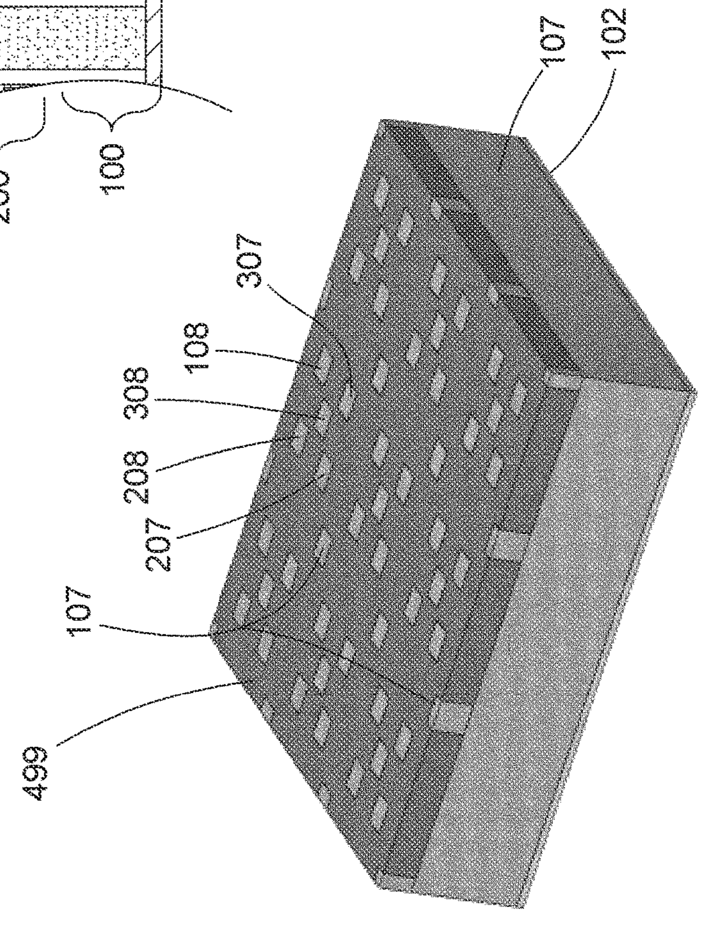
Figure 6A:
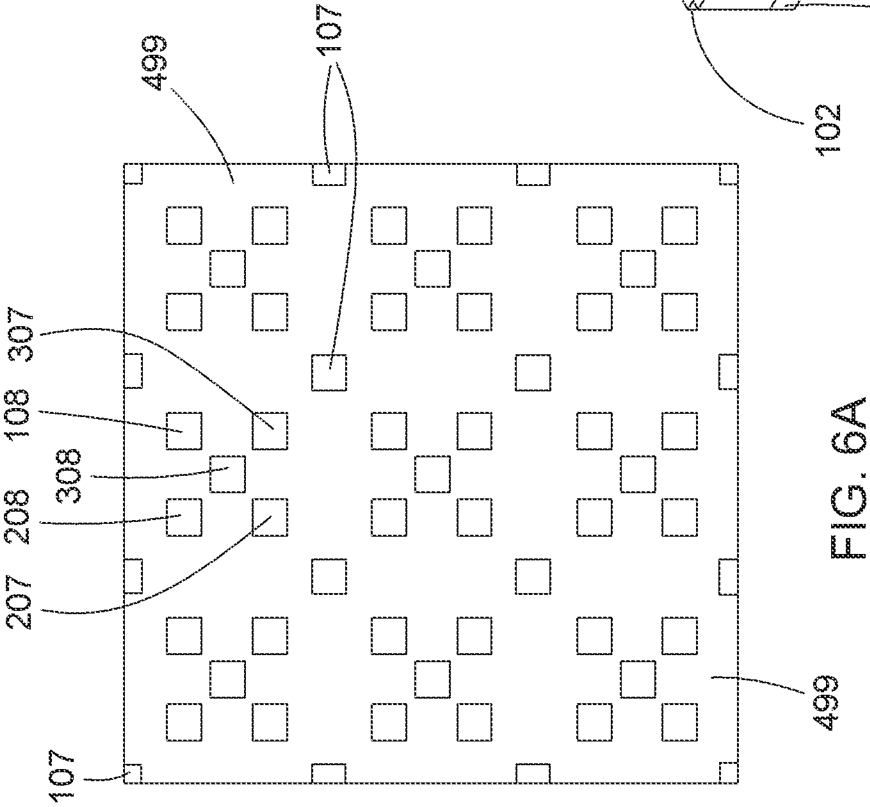
FIGS. 6A and 6B are a schematic plan view (from the contact side) and a schematic perspective view (from the light exit side) of a finished array of polychromic LED stacks (i.e., as in FIGS. 4M and 5M).
Figure 6B:
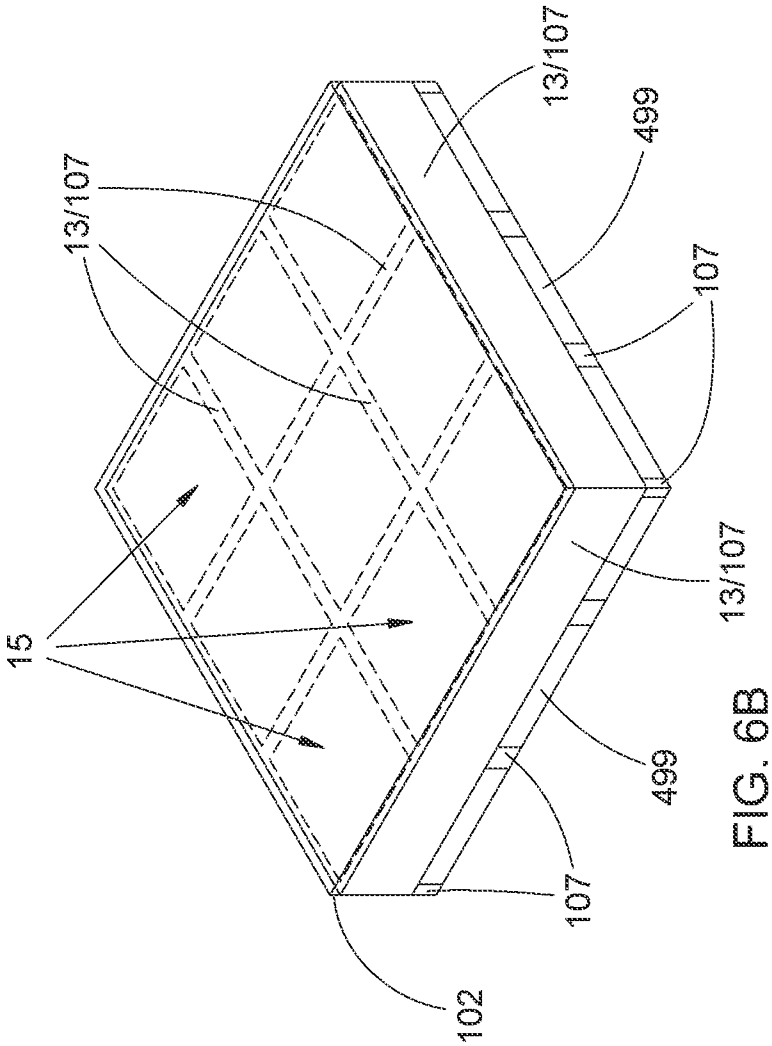

An insulating dielectric material of any suitable type is grown or deposited on the tops and sidewalls of each of the LED stacks 15 (FIGS. 4H/5H) and coating or filling the holes formed in the previous etch steps (e.g., dielectric material 398). That dielectric material is etched to expose the first n-doped layer 102 at the bottom of each trench 13, and to expose the corresponding doped semiconductor layer at the bottom of each hole, while leaving insulating material coating the sidewalls of the LED stack and the sides of each hole (FIGS. 4I/5I). Metal (e.g., gold, silver, copper, aluminum, or other suitable metal or alloy) is deposited or grown (i) within the trenches 13 to form conductive sidewall layer that act as the first cathode contact 107, and (ii) within the holes to form the second and third cathode contacts 207/307 and the first, second, and third anode contacts 108/208/308. Chemical-mechanical polishing (CMP) can be employed to form the structure of FIGS. 4J/5J. A feedthrough, interconnect, or backplane layer 499 can be formed over the dielectric layer and can include electrically conductive extensions of the LED contacts (FIGS. 4K/5K). In some examples the entire wafer or diced array of the polychromic stacks can be bonded to a driver chip, e.g., a CMOS driver chip or wafer (not shown). Any one or more suitable bonding processes can be employed, e.g., hybrid wafer-to-wafer or die-to-wafer bonding, surface mount bonding, or thermal compression bonding using, e.g., indium-based balls or tin-based balls. After bonding the support substrate 20 can then be removed (FIGS. 4L/5L), and then optionally the semiconductor substrate layer 21 can be removed (FIGS. 4M/5M), leaving the first n-doped semiconductor layer 102 as the light output surface of each polychromic LED stack 15 (FIGS. 4M/5M/6A/6B). In some examples the semiconductor substrate layer 21 or the support substrate 20 can remain in place, with emitted light exiting the device by transmission through those layers.

Figure 7B:
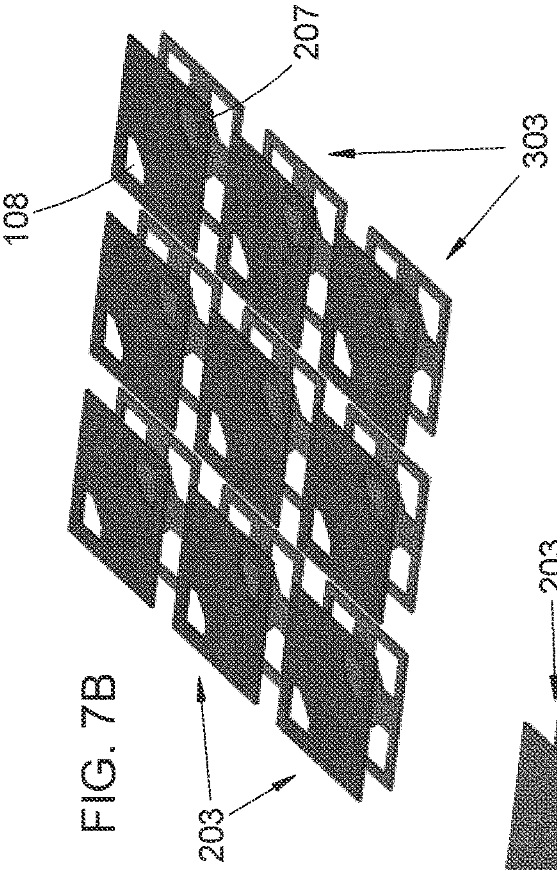
FIGS. 7A through 7C are partial perspective views of only the active layers of the polychromic LED stacks of FIGS. 4M, 5M, 6A, and 6B.
Figure 7C:
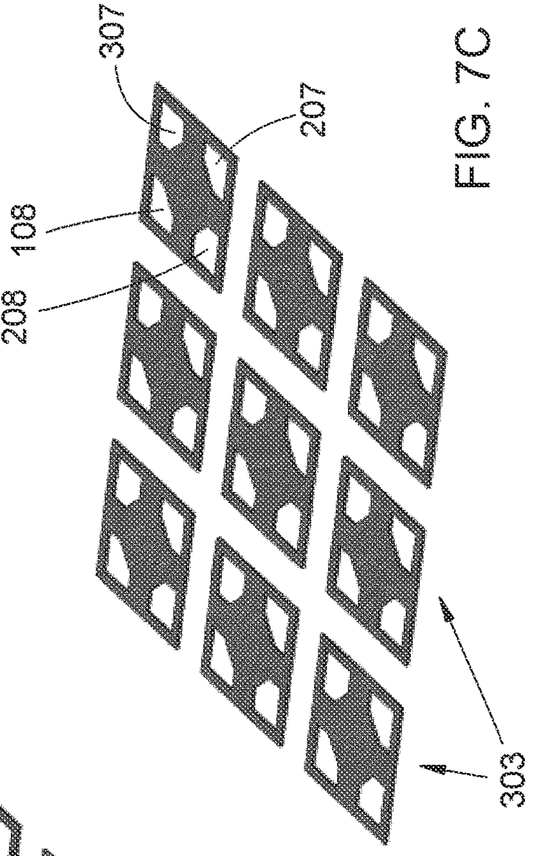
Figure 7A:
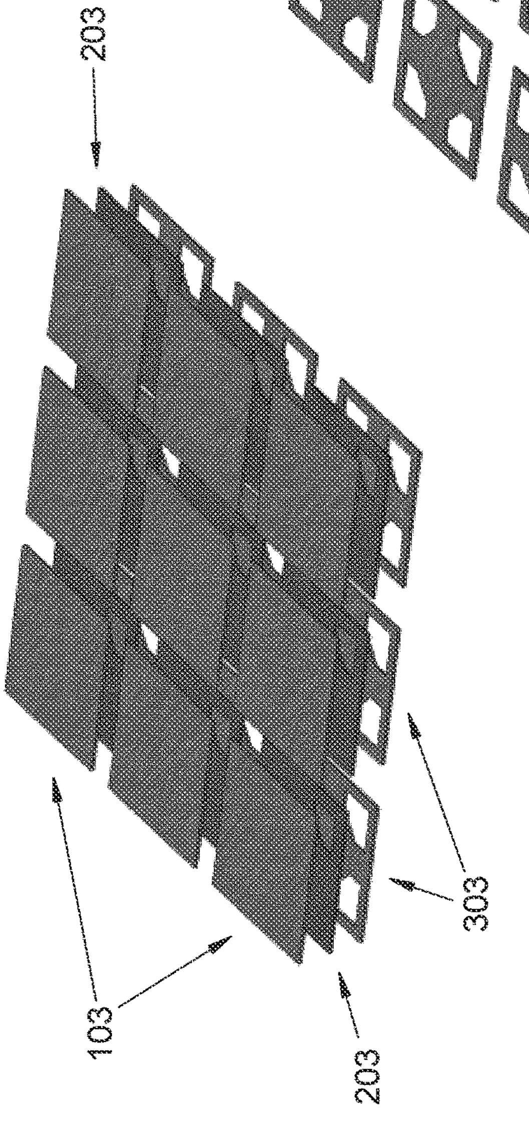

FIGS. 7A through 7C show the arrangement of the active layers 103/203/303 (isolated from the contacts and the other layers of the LED stack) after the fabrication sequence of FIGS. 4A-4M and 5A-5M. In all of the drawings, holes through various layers are labelled according to which contact passes through that hole in the finished polychromic LED stack (e.g., a hole labelled 207 will contain the second cathode contact 207 in the finished device, and so on).

In addition to the preceding, the following example embodiments fall within the scope of the present disclosure or appended claims. Any given Example below that refers to multiple preceding Examples shall be understood to refer to only those preceding Examples with which the given Example is not inconsistent, and to exclude implicitly those preceding Examples with which the given Example is inconsistent.

Example 1. A light-emitting apparatus comprising a set of one or more polychromic light-emitting diodes (LEDs), each polychromic LED comprising: (a) a first set of LED layers including (i) first p-doped and first n-doped semiconductor layers, (ii) a first active layer therebetween, the first active layer emitting light at a first nominal emission wavelength, (iii) a first tunnel junction layer positioned against the first p-doped semiconductor layer, and (iv) a first additional n-doped semiconductor layer positioned against the first tunnel junction layer with the first tunnel junction layer between the first p-doped semiconductor layer and the first additional n-doped semiconductor layer; (b) a second set of LED layers including (i) second p-doped and second n-doped semiconductor layers, (ii) a second active layer therebetween, the second active layer emitting light at a second nominal emission wavelength different from the first emission wavelength, (iii) a second tunnel junction layer positioned against the second p-doped semiconductor layer, and (iv) a second additional n-doped semiconductor layer positioned against the second tunnel junction layer with the second tunnel junction layer between the second p-doped semiconductor layer and the second additional n-doped semiconductor layer; (c) a third set of LED layers including (i) third p-doped and third n-doped semiconductor layers, (ii) a third active layer therebetween, the third active layer emitting light at a third nominal emission wavelength different from the first and second emission wavelengths, and (iii) a set of one or more electrode layers positioned against and in electrical contact with the third p-doped layer; (d) first and second semi-insulating semiconductor layers and a dielectric layer; (e) corresponding first, second, and third cathode contacts each being in electrical contact with the first, second, and third n-doped semiconductor layers, respectively, and extending past or through the dielectric layer; and (f) corresponding first, second, and third anode contacts each being in electrical contact with the first additional n-doped semiconductor layer, the second additional n-doped semiconductor layer, and the one or more electrode layers, respectively, and extending past or through the dielectric layer, (g) the first semi-insulating semiconductor layer being between the first and second sets of LED layers, the second set of LED layers being between the first and second semi-insulating semiconductor layers, the second semi-insulating semiconductor layer being between the second and third sets of LED layers, and the third set of LED layers being between the second semi-insulating semiconductor layer and the dielectric layer.

Example 2. The light-emitting apparatus of Example 1, the one or more electrode layers of the third set of LED layers including a third tunnel junction layer positioned against the third p-doped semiconductor layer, and a third additional n-doped semiconductor layer positioned against the third tunnel junction layer with the third tunnel junction layer between the third p-doped semiconductor layer and the third additional n-doped semiconductor layer.

Example 3. The light-emitting apparatus of Example 1, the one or more electrode layers of the third set of LED layers including one or more transparent conductive oxide (TCO) layers or one or more metal layers.

Example 4. The light-emitting apparatus of any one of Examples 1 through 3, the set of one or more polychromic LEDs including an array of the polychromic LEDs, each polychromic LED of the array being operable independently of at least one other polychromic LED of the array.

Example 5. The light-emitting array of Example 4, individual polychromic LEDs of the array, or groups of polychromic LEDs of the array, being operable independently of one another, the array being arranged as a display.

Example 6. The light-emitting apparatus of any one of Examples 4 or 5, the polychromic LEDs of the array being separated from one another by trenches that extend through the second and third sets of LED layers and at least some LED layers of the first set, separating each of those layers into discrete areal segments corresponding to corresponding polychromic LEDs of the array.

Example 7. The light-emitting apparatus of Example 6, the trenches being at least partially filled with one or more reflective, scattering, or absorptive light barriers.

Example 8. The light-emitting apparatus of any one of Examples 4 through 7, wherein (i) spacing of the polychromic LEDs of the array is less than 200 microns, or (ii) separation between adjacent polychromic LEDs of the array is less than 50 microns.

Example 9. The light-emitting device of any one of Examples 1 through 8, the first, second, and third emission wavelengths including a blue emission wavelength, a green emission wavelength, and a red emission wavelength that define a color gamut that encompasses at least an sRGB color gamut.

Example 10. The light-emitting device of any one of Examples 1 through 9, the first, second, and third sets of LED layers and the anode and cathode contacts being arranged so as to enable, for each of the one or more polychromic LEDs, emission of light at each of the first, second, or third emission wavelengths independently of emission at the other wavelengths.

Example 11. The light-emitting device of any one of Examples 1 through 10, wherein (i) the first, second, and third anode contacts of each polychromic LED are electrically connected to one another to form a corresponding common anode contact for that polychromic LED, or (ii) the first, second, and third cathode contacts of each polychromic LED are electrically connected to one another to form a corresponding common cathode contact for that polychromic LED.

Example 12. The light-emitting device of any one of Examples 1 through 11, wherein: (i) each of the third anode and cathode contacts is arranged as a discrete, circumscribed conductive via that extends through the dielectric layer into the third set of LED layers; (ii) each of the second anode and cathode contacts is arranged as a discrete, circumscribed conductive via that extends through the dielectric layer and the third set of LED layers and into the second set of LED layers, and is electrically insulated from the third set of LED layers; (iii) each of the first anode contacts, or each of the first cathode contacts, is arranged as a discrete, circumscribed conductive via that extends through the dielectric layer and the second and third sets of LED layers, and into the first set of LED layers, and is electrically insulated from the second and third sets of LED layers.

Example 13. The light-emitting device of Example 12 wherein each of the first anode and first cathode contacts is arranged as a discrete, circumscribed conductive via that extends through the dielectric layer and the second and third sets of LED layers, and into the first set of LED layers, and is electrically insulated from the second and third sets of LED layers.

Example 14. The light-emitting device of Example 12 wherein either each of the first anode contacts, or each of the first cathode contacts, is arranged as a conductive sidewall layer that extends through the dielectric layer, past the second and third sets of LED layers, and into the first set of LED layers, and is electrically insulated from the second and third sets of LED layers.

Example 15. An article comprising: (a) a substrate wafer; (b) a first set of LED layers including (i) first p-doped and first n-doped semiconductor layers, (ii) a first active layer therebetween, the first active layer emitting light at a first nominal emission wavelength, (iii) a first tunnel junction layer positioned against the first p-doped semiconductor layer, and (iv) a first additional n-doped semiconductor layer positioned against the first tunnel junction layer with the first tunnel junction layer between the first p-doped semiconductor layer and the first additional n-doped semiconductor layer; (c) a second set of LED layers including (i) second p-doped and second n-doped semiconductor layers, (ii) a second active layer therebetween, the second active layer emitting light at a second nominal emission wavelength different from the first emission wavelength, (iii) a second tunnel junction layer positioned against the second p-doped semiconductor layer, and (iv) a second additional n-doped semiconductor layer positioned against the second tunnel junction layer with the second tunnel junction layer between the second p-doped semiconductor layer and the second additional n-doped semiconductor layer; (d) a third set of LED layers including (i) third p-doped and third n-doped semiconductor layers, (ii) a third active layer therebetween, the third active layer emitting light at a third nominal emission wavelength different from the first and second emission wavelengths, and (iii) a set of one or more electrode layers positioned against and in electrical contact with the third p-doped layer; and (e) first and second semi-insulating semiconductor layers and a dielectric layer, (f) the first set of LED layers being between the substrate and the first semi-insulating semiconductor layer, the first semi-insulating semiconductor layer being between the first and second sets of LED layers, the second set of LED layers being between the first and second semi-insulating semiconductor layers, the second semi-insulating semiconductor layer being between the second and third sets of LED layers, and the third set of LED layers being between the second semi-insulating semiconductor layer and the dielectric layer.

Example 16. The article of Example 15, the one or more electrode layers of the third set of LED layers including a third tunnel junction layer positioned against the third p-doped semiconductor layer, and a third additional n-doped semiconductor layer positioned against the third tunnel junction layer with the third tunnel junction layer between the third p-doped semiconductor layer and the third additional n-doped semiconductor layer.

Example 17. The article of Example 15, the one or more electrode layers of the third set of LED layers including one or more transparent conductive oxide (TCO) layers or one or more metal layers.

Example 18. The article of any one of Examples 15 through 17, wherein each one of the p-doped, n-doped, additional n-doped, and semi-insulating semiconductor layers, the active layers, and the tunnel junction layers includes one or more corresponding III-V semiconductor materials or a corresponding mixture or alloy thereof.

Example 19. A method employing the article of any one of Examples 15 through 18, the method comprising: (A) etching a first set of circumscribed holes through the dielectric layer, the third set of LED layers, and the second set of LED layers and into the first set of LED layers; (B) etching a second set of circumscribed holes through the dielectric layer and the third set of LED layers into the second set of LED layers; (C) etching a third set of circumscribed holes through the dielectric layer into the third set of LED layers; (D) forming in the first set of holes a first set of conductive vias electrically insulated from the second and third sets of LED layers, the conductive vias of the first set including first cathode contacts in contact with the first n-doped semiconductor layer or first anode contacts in contact with the first additional n-doped layer; (E) forming in the second set of holes a second set of conductive vias electrically insulated from the third set of LED layers, the conductive vias of the second set including second cathode contacts in contact with the second n-doped semiconductor layer and second anode contacts in contact with the second additional n-doped semiconductor layer; (F) forming in the third set of holes a third set of conductive vias, the conductive vias of the third set including third cathode contacts in contact with the third n-doped semiconductor layer and third anode contacts in contact with the one or more electrode layers of the third set of LED layers; and (G) forming trenches through the first, second, and third LED layers to define an array of independent polychromic LEDs on the substrate.

Example 20. The method of Example 19, the conductive vias of the first set including first cathode contacts in contact with the first n-doped semiconductor layer and first anode contacts in contact with the first additional n-doped layer.

Example 21. The method of any one of Examples 19 or 20 further comprising forming conductive sidewall layers in the trenches that extend through the dielectric layer, past the second and third sets of LED layers, and into the first set of LED layers, and are electrically insulated from the second and third sets of LED layers.

Example 22. The method of any one of Examples 19 through 21 further comprising, before forming the conductive vias or before forming the conductive sidewall layers, (i) forming or depositing an insulating material on sidewalls of the trenches and within the holes of the first, second, and third sets, and (ii) etching holes through the insulating material within the holes of the first, second, and third sets, the conductive vias being formed within the etched holes.

Example 23. The method of any one of Examples 19 through 22 employed for forming the light-emitting device of any one of Examples 1 through 14.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features-which features are shown, described, or claimed in the present application-including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open-ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth, or if a differing interpretation is implicit or inherent (e.g., some small integer quantities). For null quantities described by phrases such as "equal to zero," "absent," "eliminated," "negligible," "prevented," and so forth (with or without terms such as "about," "substantially," and so forth), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled. Terms such as "parallel," "perpendicular," "orthogonal," "flush," "aligned," and so forth shall be similarly interpreted (with or without terms such as "about," "substantially," and so forth).

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112 (f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112 (f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting apparatus comprising a set of one or more polychromic light-emitting diodes (LEDs), each polychromic LED comprising:

(a) a first set of LED layers including (i) first p-doped and first n-doped semiconductor layers, (ii) a first active layer therebetween, the first active layer emitting light at a first nominal emission wavelength, (iii) a first tunnel junction layer positioned against the first p-doped semiconductor layer, and (iv) a first additional n-doped semiconductor layer positioned against the first tunnel junction layer with the first tunnel junction layer between the first p-doped semiconductor layer and the first additional n-doped semiconductor layer;

(b) a second set of LED layers including (i) second p-doped and second n-doped semiconductor layers, (ii) a second active layer therebetween, the second active layer emitting light at a second nominal emission wavelength different from the first emission wavelength, (iii) a second tunnel junction layer positioned against the second p-doped semiconductor layer, and (iv) a second additional n-doped semiconductor layer positioned against the second tunnel junction layer with the second tunnel junction layer between the second p-doped semiconductor layer and the second additional n-doped semiconductor layer;

(c) a third set of LED layers including (i) third p-doped and third n-doped semiconductor layers, (ii) a third active layer therebetween, the third active layer emitting light at a third nominal emission wavelength different from the first and second emission wavelengths, and (iii) a set of one or more electrode layers positioned against and in electrical contact with the third p-doped layer;

(d) first and second semi-insulating semiconductor layers and a dielectric layer;

(e) corresponding first, second, and third cathode contacts each being in electrical contact with the first, second, and third n-doped semiconductor layers, respectively, and extending past or through the dielectric layer; and (f) corresponding first, second, and third anode contacts each being in electrical contact with the first additional n-doped semiconductor layer, the second additional n-doped semiconductor layer, and the one or more electrode layers, respectively, and extending past or through the dielectric layer, (g) the first semi-insulating semiconductor layer being between the first and second sets of LED layers, the second set of LED layers being between the first and second semi-insulating semiconductor layers, the second semi-insulating semiconductor layer being between the second and third sets of LED layers, and the third set of LED layers being between the second semi-insulating semiconductor layer and the dielectric layer.

2. The light-emitting apparatus of claim 1, the one or more electrode layers of the third set of LED layers including a third tunnel junction layer positioned against the third p-doped semiconductor layer, and a third additional n-doped semiconductor layer positioned against the third tunnel junction layer with the third tunnel junction layer between the third p-doped semiconductor layer and the third additional n-doped semiconductor layer.

3. The light-emitting apparatus of claim 1, the one or more electrode layers of the third set of LED layers including one or more transparent conductive oxide (TCO) layers or one or more metal layers.

4. The light-emitting apparatus of claim 1, the set of one or more polychromic LEDs including an array of the polychromic LEDs, each polychromic LED of the array being operable independently of at least one other polychromic LED of the array.

5. The light-emitting array of claim 4, individual polychromic LEDs of the array, or groups of polychromic LEDs of the array, being operable independently of one another, the array being arranged as a display.

6. The light-emitting apparatus of claim 4, the polychromic LEDs of the array being separated from one another by trenches that extend through the second and third sets of LED layers and at least some LED layers of the first set, separating each of those layers into discrete areal segments corresponding to corresponding polychromic LEDs of the array.

7. The light-emitting apparatus of claim 6, the trenches being at least partially filled with one or more reflective, scattering, or absorptive light barriers.

8. The light-emitting apparatus of claim 4, wherein (i) spacing of the polychromic LEDs of the array is less than 200 microns, or (ii) separation between adjacent polychromic LEDs of the array is less than 50 microns.

9. The light-emitting device of claim 1, the first, second, and third emission wavelengths including a blue emission wavelength, a green emission wavelength, and a red emission wavelength that define a color gamut that encompasses at least an sRGB color gamut.

10. The light-emitting device of claim 1, the first, second, and third sets of LED layers and the anode and cathode contacts being arranged so as to enable, for each of the one or more polychromic LEDs, emission of light at each of the first, second, or third emission wavelengths independently of emission at the other wavelengths.

11. The light-emitting device of claim 1 wherein (i) the first, second, and third anode contacts of each polychromic LED are electrically connected to one another to form a corresponding common anode contact for that polychromic LED, or (ii) the first, second, and third cathode contacts of each polychromic LED are electrically connected to one another to form a corresponding common cathode contact for that polychromic LED.

12. The light-emitting device of claim 1 wherein:

(i) each of the third anode and cathode contacts is arranged as a discrete, circumscribed conductive via that extends through the dielectric layer into the third set of LED layers;

(ii) each of the second anode and cathode contacts is arranged as a discrete, circumscribed conductive via that extends through the dielectric layer and the third set of LED layers and into the second set of LED layers, and is electrically insulated from the third set of LED layers;

(iii) each of the first anode contacts, or each of the first cathode contacts, is arranged as a discrete, circumscribed conductive via that extends through the dielectric layer and the second and third sets of LED layers, and into the first set of LED layers, and is electrically insulated from the second and third sets of LED layers.

13. The light-emitting device of claim 12 wherein each of the first anode and first cathode contacts is arranged as a discrete, circumscribed conductive via that extends through the dielectric layer and the second and third sets of LED layers, and into the first set of LED layers, and is electrically insulated from the second and third sets of LED layers.

14. The light-emitting device of claim 12 wherein either each of the first anode contacts, or each of the first cathode contacts, is arranged as a conductive sidewall layer that extends through the dielectric layer, past the second and third sets of LED layers, and into the first set of LED layers, and is electrically insulated from the second and third sets of LED layers.

15. An article comprising:

(a) a substrate wafer;

(b) a first set of LED layers including (i) first p-doped and first n-doped semiconductor layers, (ii) a first active layer therebetween, the first active layer emitting light at a first nominal emission wavelength, (iii) a first tunnel junction layer positioned against the first p-doped semiconductor layer, and (iv) a first additional n-doped semiconductor layer positioned against the first tunnel junction layer with the first tunnel junction layer between the first p-doped semiconductor layer and the first additional n-doped semiconductor layer;

(c) a second set of LED layers including (i) second p-doped and second n-doped semiconductor layers, (ii) a second active layer therebetween, the second active layer emitting light at a second nominal emission wavelength different from the first emission wavelength, (iii) a second tunnel junction layer positioned against the second p-doped semiconductor layer, and (iv) a second additional n-doped semiconductor layer positioned against the second tunnel junction layer with the second tunnel junction layer between the second p-doped semiconductor layer and the second additional n-doped semiconductor layer;

(d) a third set of LED layers including (i) third p-doped and third n-doped semiconductor layers, (ii) a third active layer therebetween, the third active layer emitting light at a third nominal emission wavelength different from the first and second emission wavelengths, and (iii) a set of one or more electrode layers positioned against and in electrical contact with the third p-doped layer; and (e) first and second semi-insulating semiconductor layers and a dielectric layer, (f) the first set of LED layers being between the substrate and the first semi-insulating semiconductor layer, the first semi-insulating semiconductor layer being between the first and second sets of LED layers, the second set of LED layers being between the first and second semi-insulating semiconductor layers, the second semi-insulating semiconductor layer being between the second and third sets of LED layers, and the third set of LED layers being between the second semi-insulating semiconductor layer and the dielectric layer.

16. The article of claim 15 wherein each one of the p-doped, n-doped, additional n-doped, and semi-insulating semiconductor layers, the active layers, and the tunnel junction layers includes one or more corresponding III-V semiconductor materials or a corresponding mixture or alloy thereof.

17. A method employing the article of claim 15, the method comprising:

(A) etching a first set of circumscribed holes through the dielectric layer, the third set of LED layers, and the second set of LED layers and into the first set of LED layers;

(B) etching a second set of circumscribed holes through the dielectric layer and the third set of LED layers into the second set of LED layers;

(C) etching a third set of circumscribed holes through the dielectric layer into the third set of LED layers;

(D) forming in the first set of holes a first set of conductive vias electrically insulated from the second and third sets of LED layers, the conductive vias of the first set including first cathode contacts in contact with the first n-doped semiconductor layer or first anode contacts in contact with the first additional n-doped layer;

(E) forming in the second set of holes a second set of conductive vias electrically insulated from the third set of LED layers, the conductive vias of the second set including second cathode contacts in contact with the second n-doped semiconductor layer and second anode contacts in contact with the second additional n-doped semiconductor layer;

(F) forming in the third set of holes a third set of conductive vias, the conductive vias of the third set including third cathode contacts in contact with the third n-doped semiconductor layer and third anode contacts in contact with the one or more electrode layers of the third set of LED layers; and (G) forming trenches through the first, second, and third LED layers to define an array of independent polychromic LEDs on the substrate.

18. The method of claim 17, the conductive vias of the first set including first cathode contacts in contact with the first n-doped semiconductor layer and first anode contacts in contact with the first additional n-doped layer.

19. The method of claim 17 further comprising forming conductive sidewall layers in the trenches that extend through the dielectric layer, past the second and third sets of LED layers, and into the first set of LED layers, and are electrically insulated from the second and third sets of LED layers.

20. The method of claim 17 further comprising, before forming the conductive vias, (i) forming or depositing an insulating material on sidewalls of the trenches and within the holes of the first, second, and third sets, and (ii) etching holes through the insulating material within the holes of the first, second, and third sets, the conductive vias being formed within the etched holes.

* * * * *